United States Patent
Lee et al.

(10) Patent No.: US 12,360,421 B2
(45) Date of Patent: Jul. 15, 2025

(54) OPTICAL PATH CONTROL MEMBER AND DISPLAY DEVICE COMPRISING SAME

(71) Applicant: LG INNOTEK CO., LTD., Seoul (KR)

(72) Inventors: Jong Sik Lee, Seoul (KR); Jin Gyeong Park, Seoul (KR); Byung Sook Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/724,414

(22) PCT Filed: Nov. 23, 2022

(86) PCT No.: PCT/KR2022/018594
§ 371 (c)(1),
(2) Date: Jun. 26, 2024

(87) PCT Pub. No.: WO2023/128290
PCT Pub. Date: Jul. 6, 2023

(65) Prior Publication Data
US 2025/0068014 A1   Feb. 27, 2025

(30) Foreign Application Priority Data
Dec. 28, 2021  (KR) .................. 10-2021-0190083
Dec. 28, 2021  (KR) .................. 10-2021-0190125

(51) Int. Cl.
G02F 1/1343    (2006.01)
G02F 1/1339    (2006.01)

(52) U.S. Cl.
CPC ...... *G02F 1/134309* (2013.01); *G02F 1/1339* (2013.01)

(58) Field of Classification Search
None
See application file for complete search history.

(56) References Cited

U.S. PATENT DOCUMENTS 8,908,257 B2    12/2014  Song et al.
10,338,300 B2*  7/2019  You .................. G02B 6/005
(Continued)

FOREIGN PATENT DOCUMENTS

JP    2010-85566 A    4/2010
JP    2013-37190 A    2/2013
(Continued)

OTHER PUBLICATIONS

International Search Report dated Feb. 20, 2023 in International Application No. PCT/KR2022/018594.
(Continued)

*Primary Examiner* — Donald L Raleigh
(74) *Attorney, Agent, or Firm* — Saliwanchik, Lloyd & Eisenschenk

(57) ABSTRACT

An optical path control member according to an embodiment includes a first substrate; a first electrode disposed on the first substrate; a second substrate disposed on the first substrate; a second electrode disposed under the second substrate; a light conversion unit disposed between the first electrode and the second electrode and including a plurality of accommodating parts in which a light conversion material is disposed; a first sealing part and a second sealing part formed in a cutting region formed by cutting the second substrate, the second electrode, and the light conversion unit and disposed extending in a first direction; and a third sealing part and a fourth sealing part formed in the cutting region formed by cutting the second substrate, the second electrode, and the light conversion unit, and disposed extending in a second direction different from the first direction, and wherein at least one of the third sealing part and the fourth sealing part includes a sealing region disposed inside the cutting region and an anchor region disposed inside the accommodating part.

20 Claims, 27 Drawing Sheets

(56) References Cited

U.S. PATENT DOCUMENTS

| | | |
|---|---|---|
| 11,500,199 B2 | 11/2022 | Song et al. |
| 2013/0292649 A1 | 11/2013 | Moon et al. |
| 2023/0161187 A1 | 5/2023 | Lee et al. |

FOREIGN PATENT DOCUMENTS

| | | |
|---|---|---|
| KR | 10-2012-0062455 A | 6/2012 |
| KR | 10-2013-0123507 A | 11/2013 |
| KR | 10-2015-0103788 A | 9/2015 |
| KR | 10-2016-0147121 A | 12/2016 |
| KR | 10-2018-0004879 A | 1/2018 |
| KR | 10-2020-0077023 A | 6/2020 |
| KR | 10-2021-0136600 A | 11/2021 |
| KR | 10-2021-0136603 A | 11/2021 |
| WO | 2021/221358 A1 | 11/2021 |

OTHER PUBLICATIONS

Office Action dated Nov. 25, 2024 in Korean Application No. 10-2021-0190083.
Office Action dated Nov. 19, 2024 in Korean Application No. 10-2021-0190125.

* cited by examiner

FIG. 29
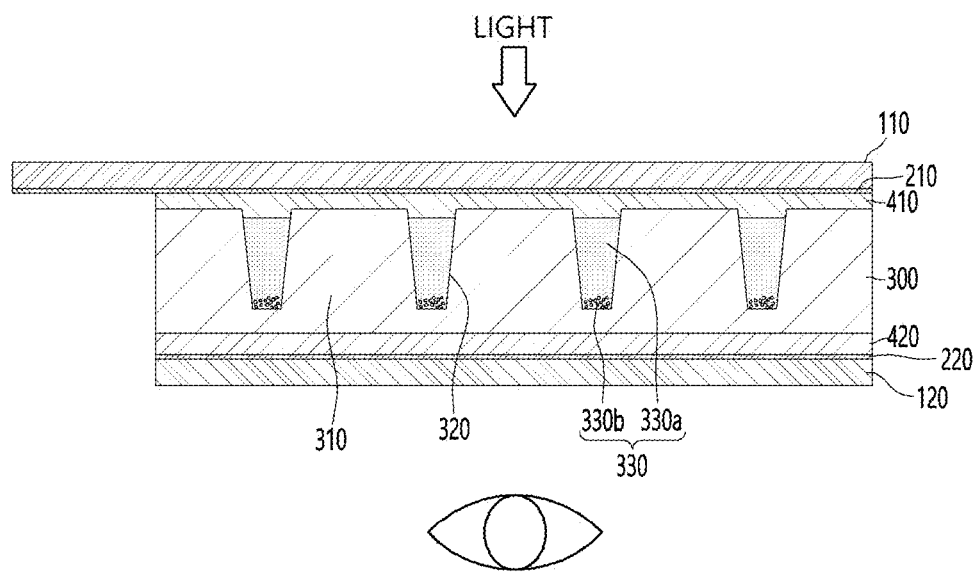
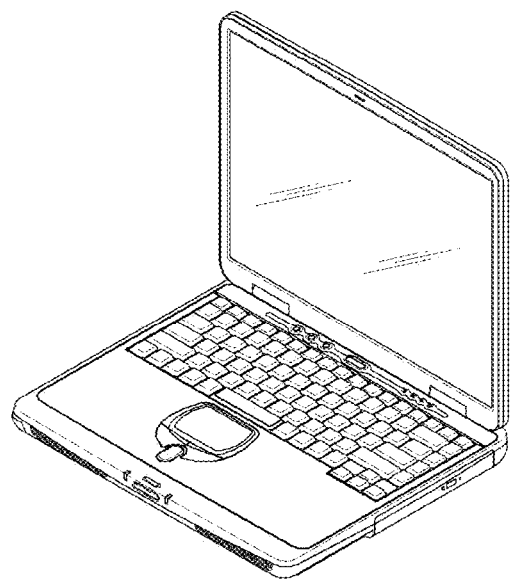
PUBLICATION MODE

FIG. 30
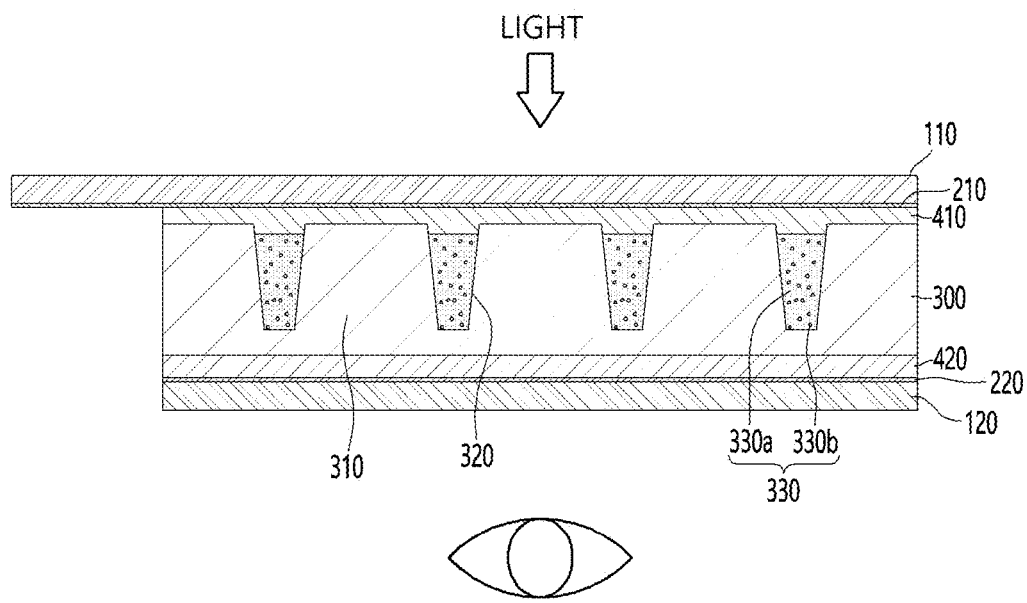
PRIVACY MODE
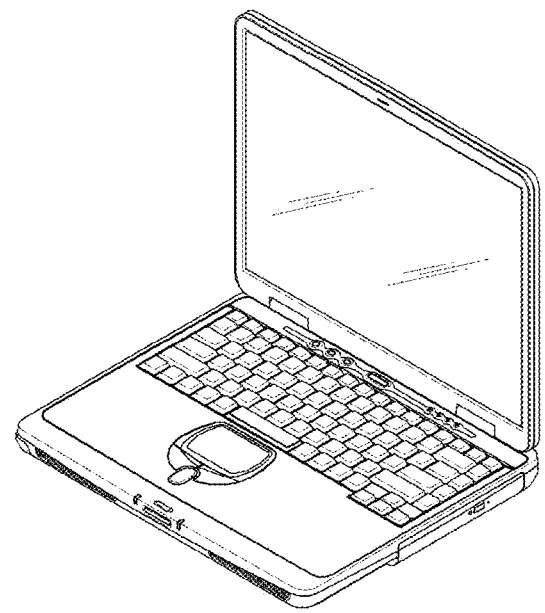

OPTICAL PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2022/018594, filed Nov. 23, 2022, which claims the benefit under 35 U.S.C. § 119 of Korean Application Nos. 10-2021-0190083, filed Dec. 28, 2021; and 10-2021-0190125, filed Dec. 28, 2021; the disclosures of each of which are incorporated herein by reference in their entirety.

TECHNICAL FIELD

An embodiment relates to an optical path control member and a display device including the same.

BACKGROUND ART

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may control a movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by converting a pattern part into a light transmitting part and a light blocking part by filling the inside of the pattern part with particles that may move when a voltage is applied and a dispersion liquid for dispersing the particles and by dispersing and aggregating the particles.

In this case, in order to provide a voltage to the pattern part, an electrode of the optical path control member is connected to an external power source. An electrode connection part connected to the external power source may be defined as a bezel region in the display device.

Meanwhile, one surface of the optical path control member may be cut. A sealing part may be formed by filling a cut region with a sealing material. Accordingly, a light conversion material may be sealed inside the pattern part.

However, external moisture may penetrate into the light conversion material through the sealing part. Accordingly, stains can be seen from the outside. In addition, the light conversion efficiency of the optical path control member can be reduced.

Accordingly, in order to solve the above problems, an optical path control member having a new structure is required.

DISCLOSURE

Technical Problem

An embodiment provides an optical path control member with improved reliability.

Technical Solution

An optical path control member according to an embodiment includes a first substrate; a first electrode disposed on the first substrate; a second substrate disposed on the first substrate; a second electrode disposed under the second substrate; a light conversion unit disposed between the first electrode and the second electrode and including a plurality of accommodating parts in which a light conversion material is disposed; a first sealing part and a second sealing part formed in a cutting region formed by cutting the second substrate, the second electrode, and the light conversion unit and disposed extending in a first direction; and a third sealing part and a fourth sealing part formed in the cutting region formed by cutting the second substrate, the second electrode, and the light conversion unit, and disposed extending in a second direction different from the first direction, and wherein at least one of the third sealing part and the fourth sealing part includes a sealing region disposed inside the cutting region and an anchor region disposed inside the accommodating part.

Advantageous Effects

The optical path control member according to the embodiment includes an accommodating part of the optical path control member that is tilted and arranged in a length direction and a width direction of the optical path control member. Accordingly, the accommodating part can be sealed by different sealing parts.

In addition, the first sealing part, the second sealing part, the third sealing part, and the fourth sealing part each include an anchor region inserted into the accommodating part.

The anchor region may protect a light conversion material disposed inside the accommodating part. That is, when moisture flows into the accommodating part from the outside of the optical path control member, the penetration of the moisture may be inhibited by the anchor region disposed inside the accommodating part.

Accordingly, it is possible to inhibit stains formed by the reaction of light conversion material with the moisture penetrating into the accommodating part. In addition, it is possible to inhibit a decrease in the efficiency of the light conversion material due to a change in properties of the light conversion material.

Accordingly, the optical path control member according to an embodiment may have improved reliability.

In addition, the third sealing part and the fourth sealing part have anchor regions having different sizes. That is, a length of the anchor region of the third sealing part may increase while extending in one direction. In addition, a length of the anchor region of the fourth sealing part may decrease while extending in another direction opposite to one direction.

Accordingly, the optical path control member according to an embodiment includes regions having different lengths of anchor regions. Thus, the optical path control member may be applied using various methods. In addition, a length of an inactive region in which the light conversion material is not disposed may be minimized.

Specifically, a greater anchor region is more effective in inhibiting moisture from penetrating than a smaller anchor region. Accordingly, when the optical path control member and another member are connected, moisture penetration may be inhibited even when the sealing part is exposed to the outside in the region having a greater anchor region.

In addition, a smaller anchor region has a greater light conversion area than a greater anchor region. Accordingly, when the optical path control member and another member are connected, the light conversion efficiency may be maintained even if the accommodating part is partially covered in a smaller anchor region.

DESCRIPTION OF DRAWINGS

FIGS. 29 to 31 are views for describing one embodiment of the display device to which the optical path control member according to the embodiment is applied.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and redisposed.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an optical path control member according to an embodiment will be described with reference to drawings. The optical path control member described below may be a switchable light blocking film that operates in public mode and light blocking mode depending on the application of power.

Figure 1:
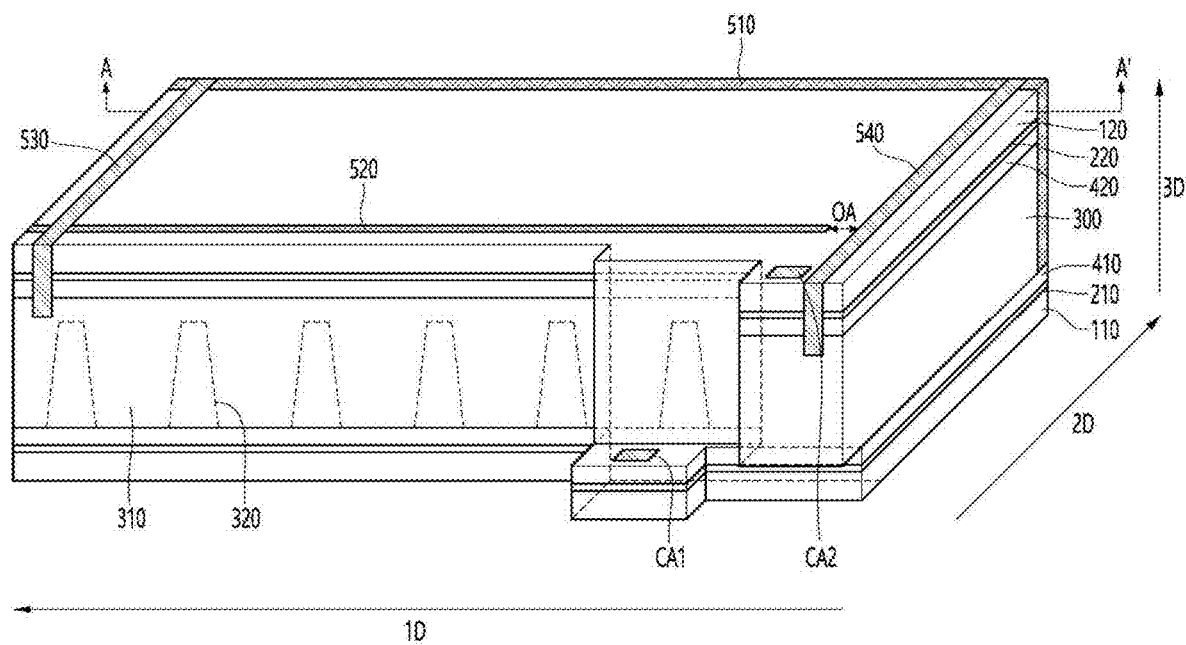
FIG. 1 is a diagram illustrating a perspective view of an optical path control member according to an embodiment.

FIG. 1 is a diagram showing a perspective view of an optical path control member according to an embodiment.

Referring to FIG. 1, the optical path control member 1000 according to the embodiment includes a first substrate 110, a second substrate 120, a first electrode 210, a second electrode 220, and a light conversion unit 300.

The first substrate 110 may support the first electrode 210. The first substrate 110 may be rigid or flexible.

In addition, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS). However, the embodiment is not limited thereto.

In addition, the first substrate 110 may be a flexible substrate having flexible characteristics.

In addition, the first substrate 110 may be a curved or bent substrate. That is, the optical path control member including the first substrate 110 may also be formed to have flexible, curved, or bent characteristics. Accordingly, the optical path control member according to an embodiment may be changed in various designs.

The first substrate 110 may extend in a first direction 1D, a second direction 2D, and a third direction 3D.

Specifically, the first substrate 110 may include a first direction 1D corresponding to a length or width direction of the first substrate 110, a second direction 2D extending in a direction different from the first direction 1D and corresponding to the length or width direction of the first substrate 110 and corresponding to the length or width direction of the first substrate 110, and a third direction 3D extending in a direction different from the first direction 1D and the second direction 2D and corresponding to a thickness direction of the first substrate 110.

For example, the first direction 1D may be defined as a length direction of the first substrate 110. Also, the second direction 2D may be defined as a width direction of the first substrate 110 perpendicular to the first direction 1D. Also, the third direction 3D may be defined as a thickness direction of the first substrate 110.

Alternatively, the first direction 1D may be defined as a width direction of the first substrate 110. Also, the second direction 2D may be defined as a length direction of the first substrate 110 perpendicular to the first direction 1D. Also, the third direction 3D may be defined as a thickness direction of the first substrate 110.

Hereinafter, for convenience of description, the first direction 1D is defined as the length direction of the first substrate 110. Also, the second direction 2D is defined as the width direction of the first substrate 110. Also, the third direction 3D is defined as the thickness direction of the first substrate 110.

The first substrate 110 may have a thickness within a predetermined range. For example, the first substrate 110 may have a thickness of 25 to 150 μm.

The first electrode 210 may be disposed on one surface of the first substrate 110. Specifically, the first electrode 210 may be disposed on an upper surface of the first substrate 110. That is, the first electrode 210 may be disposed between the first substrate 110 and the second substrate 120.

The first electrode 210 may have a thickness of about 10 nm to about 300 nm.

The first electrode 210 may include a transparent conductive material. For example, the first electrode 210 may include a conductive material having a light transmittance of about 80% or more. For example, the first electrode 210 may include at least one metal oxide of indium tin oxide, indium zinc oxide, copper oxide, tin oxide, zinc oxide, titanium oxide, etc.

Alternatively, the first electrode 210 may include various metals to realize low resistance. For example, the first electrode 210 may include at least one of chromium (Cr), nickel (Ni), copper (Cu), aluminum (Al), silver (Ag), molybdenum (Mo). Gold (Au), titanium (Ti), and alloys thereof.

The first electrode 210 may be disposed on an entire surface of one surface of the first substrate 110. Specifically, the first electrode 210 may be disposed as a surface electrode on one surface of the first substrate 110. However, the embodiment is not limited thereto, and the first electrode 210 may be formed at a pattern electrode having a mesh shape or a stripe shape.

For example, the first electrode 210 may include a plurality of conductive patterns. Specifically, the first electrode 210 may include a plurality of mesh lines that cross each other and a plurality of mesh openings formed by the mesh lines.

Accordingly, even if the first electrode 210 includes a metal, since the first electrode is not visually recognized from the outside. In addition, since the light transmittance is increased by the openings, the optical path control member may have improved luminance.

The second substrate 120 may be disposed on the first substrate 110. Specifically, the second substrate 120 may be disposed on the first electrode 210 on the first substrate 110.

The second substrate 120 may include the same material as the first substrate 110 described above. For example, the second substrate 120 may include the same material as the first substrate 110 or a different material among the materials of the first substrate 110 described above.

In addition, the second substrate 120 may have a thickness equal to or similar to that of the first substrate 110 described above. For example, the second substrate 120 may have a thickness of 25 to 150 μm.

In addition, the second substrate 120 may also extend in the first direction 1D, the second direction 2D, and the third direction 3D to correspond to the first substrate 110 described above. Hereinafter, for convenience of description, the first direction 1D is defined as the length direction of the second substrate 120. Also, the second direction 2D is defined as the width direction of the second substrate 120. Also, the third direction 3D is defined as the thickness direction of the second substrate 120.

The second electrode 220 may be disposed on one surface of the second substrate 120. In detail, the second electrode 220 may be disposed on a lower surface of the second substrate 120. That is, the second electrode 220 may be disposed on a surface of the second substrate 120 facing the first substrate 110. That is, the second electrode 220 may be disposed to face the first electrode 210 on the first substrate 110. That is, the second electrode 220 may be disposed between the first electrode 210 and the second substrate 120.

The second electrode 220 may include a material that is the same as or similar to that of the first electrode 210 described above. For example, the second electrode 220 may include a material that is the same as or different from that of the first electrode 210 among the materials of the first electrode 210 described above.

In addition, the second electrode 220 may be formed to have a thickness the same as or similar to that of the first electrode 210. For example, the second electrode 220 may have a thickness of about 10 nm to about 300 nm.

In addition, the second electrode 220 may be formed to have the same or similar thickness as the first electrode 210 described above. In addition, the second electrode 220 may be formed in a shape the same as or similar to that of the first electrode 210 described above. For example, the second electrode 220 may be disposed as a surface electrode or a plurality of pattern electrodes.

The first substrate 110 and the second substrate 120 may have the same or different sizes.

Specifically, a first length extending in the first direction 1D of the first substrate 110 may have a size equal to or similar to a second length extending in the first direction 1D of the second substrate 120.

For example, the first length and the second length may have a size of 300 mm to 400 mm.

In addition, a first width extending in the second direction 2D of the first substrate 110 may have the same or similar size as a second width extending in the second direction of the second substrate 120.

For example, the first width and the second width may have a size of 150 mm to 200 mm.

In addition, the first substrate 110 and the second substrate 120 may be formed in different areas.

Figure 2:
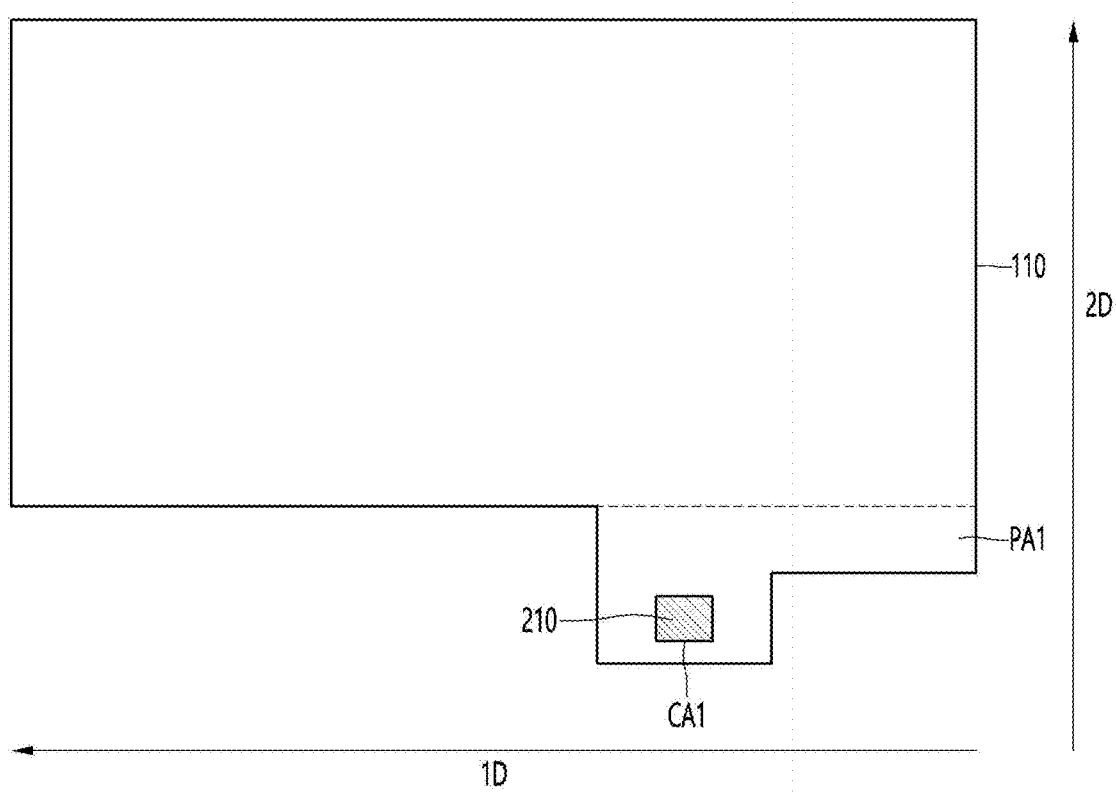
FIG. 2 is a top view of a first substrate of an optical path control member according to an embodiment.
Figure 3:
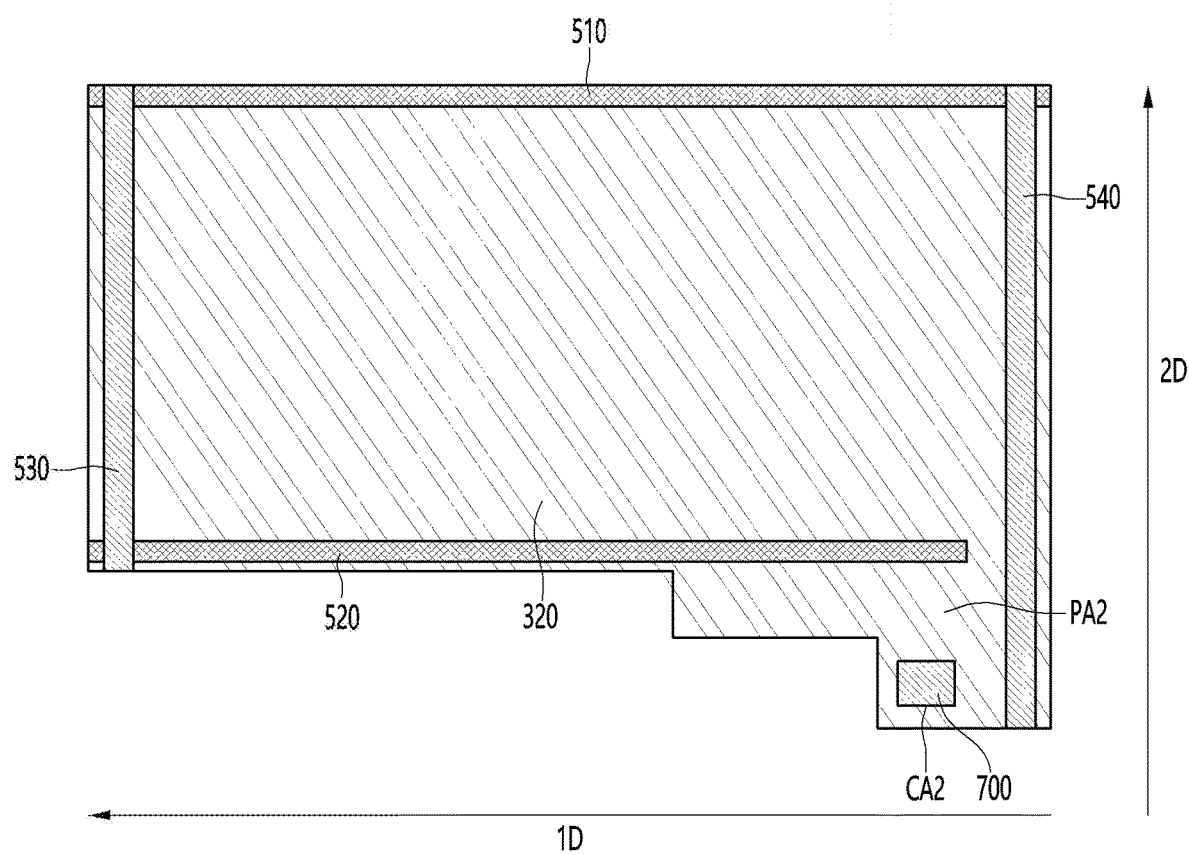
FIG. 3 is a top view of a second substrate of an optical path control member according to an embodiment.

Specifically, the first substrate 110 and the second substrate 120 may include protrusions. Referring to FIGS. 2 and 3, the first substrate 110 may include a first protrusion PA1, and the second substrate 120 may include a second protrusion PA2. Specifically, the first substrate 110 and the second substrate 120 may include a first protrusion PA1 and a second protrusion PA2 disposed to be misaligned with each other, respectively.

That is, the first protrusion PA1 and the second protrusion PA2 may be disposed not to overlap each other in the third direction 3D.

Alternatively, an embodiment is not limited thereto. For example, the first protrusion PA1 and the second protrusion PA2 may include an overlapping region and a non-overlapping region. That is, the first protrusion PA1 and the second protrusion PA2 may include an overlapping region and a non-overlapping region in the third direction.

In this case, the first protrusion PA1 and the second protrusion PA2 may have different areas. That is, the first substrate 110 and the second substrate 120 may have different sizes by the difference in sizes of the protrusions.

Connection regions connected to an external printed circuit board or a flexible printed circuit board may be formed on the first protrusion PA1 and the second protrusion PA2, respectively.

Specifically, the first protrusion PA1 may include a first connection region CA1, and the second protrusion PA2 may include a second connection region CA2. When the first protrusion PA1 and the second protrusion PA2 are disposed at positions that are misaligned from each other, the first connection region CA1 and the second connection region CA2 may be disposed not to overlap each other in the third direction 3D.

A conductive material may be exposed on upper surfaces of the first connection region CA1 and the second connection region CA2. For example, a first electrode 210 may be exposed in the first connection region CA1, and a conductive material may be exposed in the second connection region CA2. That is, a cutting region for filling the conductive material 700 may be formed in the second protrusion PA2 of the second substrate 120. The cutting region may be filled with a conductive material, thereby forming the second connection region CA2.

Accordingly, the optical path control member may be electrically connected to an external printed circuit board or a flexible printed circuit board through the first connection region CA1 and the second connection region CA2.

For example, a pad part may be disposed on the first connection region CA1 and the second connection region CA2. A conductive adhesive including at least one of an anisotropic conductive film ACF and an anisotropic conductive paste ACP may be disposed between the pad part and the printed circuit board or the flexible printed circuit board. Accordingly, the optical path control member may be connected to the external printed circuit board.

Alternatively, a conductive adhesive including at least one of an anisotropic conductive film ACF and an anisotropic conductive paste ACP may be directly disposed between the first connection region CA1 and the second connection region CA2 and the printed circuit board or the flexible printed circuit board. Accordingly, the optical path control member may be directly connected to the external printed circuit board without a pad part.

The light conversion unit 300 is disposed between the first substrate 110 and the second substrate 120. Specifically, the light conversion unit 300 is disposed between the first electrode 210 and the second electrode 220.

An adhesive layer or a buffer layer may be disposed in at least one of a region between the light conversion unit 300 and the first substrate 110 or a region between the light conversion unit 300 and the second substrate 120. The first substrate 110, the second substrate 120, and the light conversion unit 300 may be adhered by the adhesive layer and/or the buffer layer.

For example, an adhesive layer 410 may be disposed between the first electrode 210 and the light conversion unit 300. Accordingly, the first substrate 110 and the light conversion unit 300 may be adhered to each other.

The adhesive layer 410 has a thickness within a predetermined range. For example, the adhesive layer 410 may have a thickness of 10 μm to 30 μm.

In addition, a buffer layer 420 may be disposed between the second electrode 220 and the light conversion unit 300. Accordingly, adhesion between the second electrode 220 and the light conversion unit 300 including different materials may be improved.

The buffer layer 420 has a thickness within a set range. For example, the buffer layer 420 may have a thickness of less than 1 μm.

The light conversion unit 300 includes a plurality of partition wall parts 310 and a accommodating part 320. A light conversion material 330 may be disposed inside the accommodating part 320. The light conversion material 330 includes light conversion particles that move according to the application of a voltage and a dispersion liquid that disperses the light conversion particles. The light transmission characteristic of the light path control member may be changed by the light conversion particles.

Figure 4:
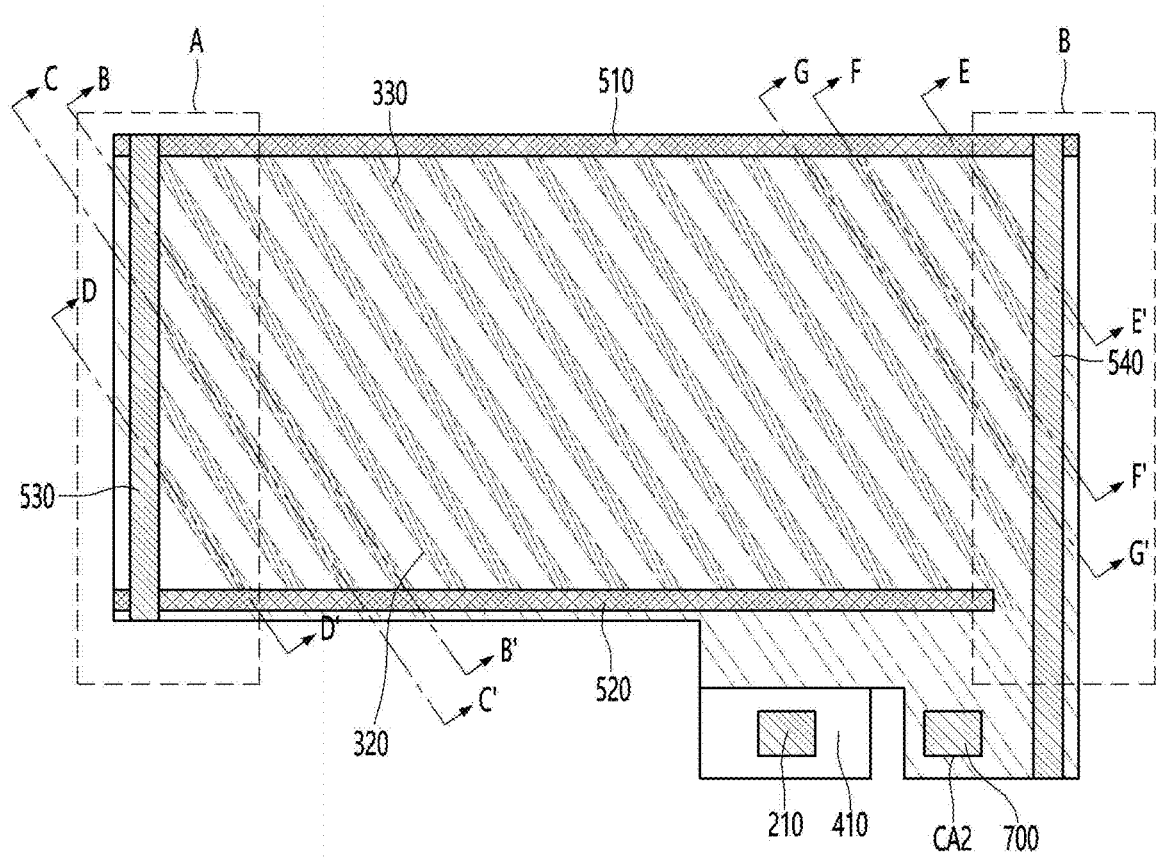
FIG. 4 is a top view of a second substrate in a state in which the first and second substrates of an optical path control member according to an embodiment are laminated.

Referring to FIGS. 3 and 4, the accommodating part 320 may be disposed to extend in one direction. Specifically, the accommodating part 320 may be tilted at an angle within a set range.

For example, the accommodating part 320 may extend in a direction different from the first and second directions 1D and 2D. That is, the accommodating part 320 may be tilted with respect to the first and second directions 1D and 2D. For example, the accommodating part 320 may extend in a direction between the first and second directions 1D and 2D.

Specifically, at least one of the accommodating parts may contact a first sealing part 510 and a second sealing part 520. Alternatively, at least one other accommodating part of the accommodating parts may contact a first sealing part 510 and a fourth sealing part 540. Alternatively, at least one of the accommodating parts may contact a second sealing part 520 and a third sealing part 530. That is, the accommodating part may extend in a fourth-first direction.

Accordingly, the above accommodating parts (320) may be sealed by the same sealing parts or different sealing parts.

For example, all of the accommodating parts 320 may be sealed by the first sealing part 510 and the second sealing part 520.

Alternatively, at least one of the accommodating parts 320 may be sealed by the first sealing part 510 and the third sealing part 530. In addition, at least one other accommodating part of the accommodating parts 320 may be sealed by the first sealing part 510 and the second sealing part 520. In addition, at least one other of the accommodating parts 320 may be sealed by the second sealing part 520 and the fourth sealing part 540.

Since the accommodating part 320 is tilted at an inclination angle of a set size with the first direction 1D and the second direction 2D, when the optical path control member is combined with the display panel, it is possible to inhibit a moiré phenomenon caused by overlapping the accommodating part of the optical path control member and a pattern part of the display panel.

Since the accommodating part 320 is tilted and arranged at an inclination angle of a predetermined size, lengths of the accommodating parts may be different. Specifically, a length of the accommodating part 320 may be changed while extending in the first direction 1D. More specifically, the length of the accommodating part 320 may increase and then decrease while extending in the direction of the third sealing part 530 to the fourth sealing part 540.

Figure 5:
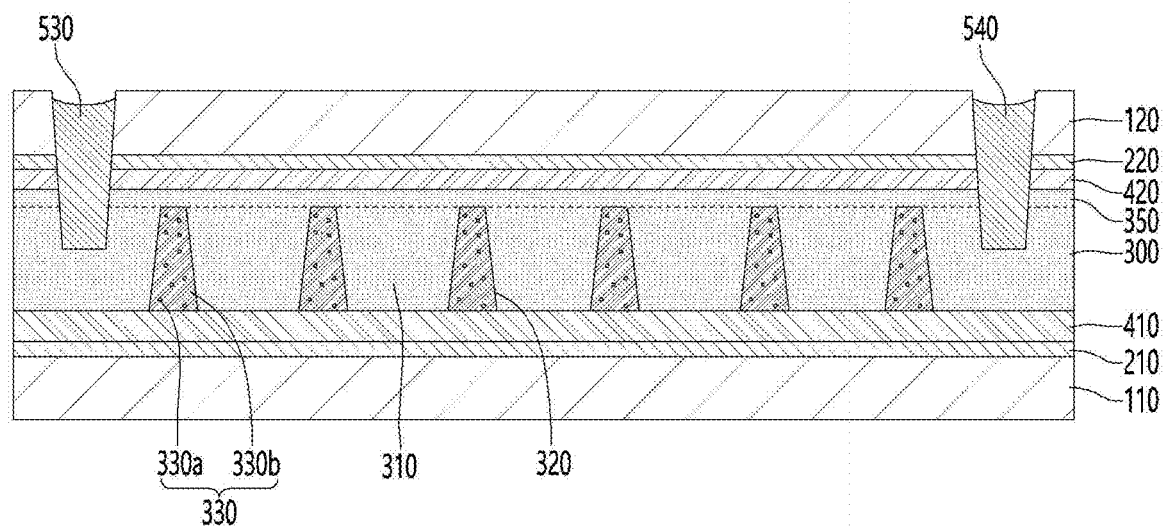
FIGS. 5 and 6 are cross-sectional views taken along a A-A' region of FIG. 1.
Figure 6:
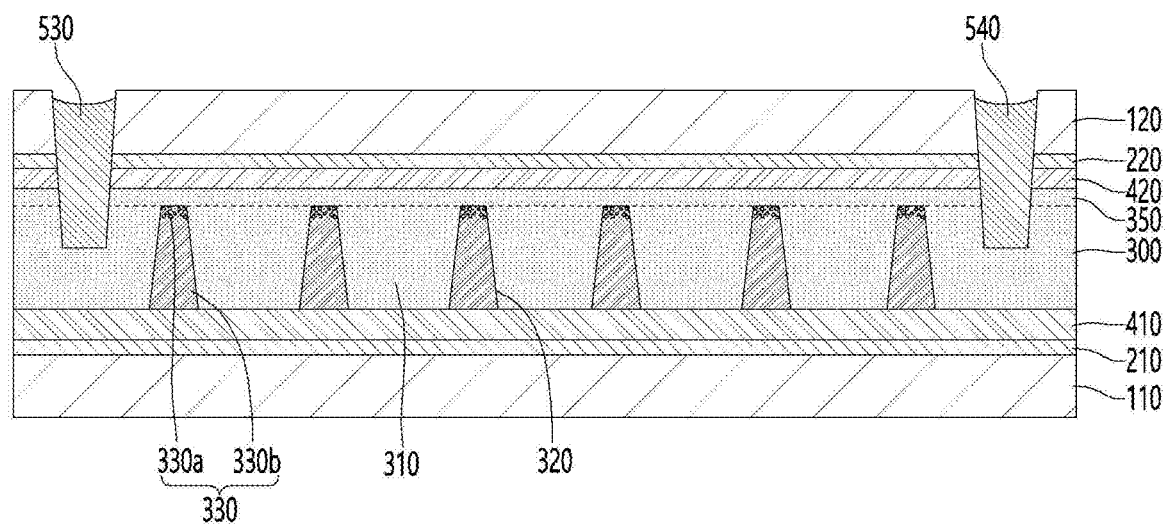

FIGS. 5 and 6 are cross-sectional views taken along a A-A' region of FIG. 1.

Referring to FIGS. 5 and 6, the light conversion unit 300 includes a partition wall part 310 and an accommodating part 320.

The partition wall part 310 may be defined as a partition wall region for partitioning the accommodating part. The partition wall part 310 may transmit light. Accordingly, light emitted from a direction of the first substrate 110 or the second substrate 120 may transmit the partition wall part.

The partition wall part 310 and the accommodating part 320 may have different widths. For example, a width of the partition wall part 310 may be greater than a width of the accommodating part 320.

Additionally, the accommodating part 320 may be formed in a shape whose width narrows while extending from the first electrode 210 toward the second electrode 220.

The partition wall part 310 and the accommodating part 320 may be alternately disposed. Each of the partition wall parts 310 may be disposed between the accommodating parts 320 adjacent to each other, and each of the accommodating parts 320 may be disposed between the partition wall parts 310 adjacent to each other.

The partition wall part 310 may include a transparent material. The partition wall part 310 may include a material capable of transmitting light.

The partition wall part 310 may include a resin material. For example, the partition wall part 310 may include a photocurable resin material. For example, the partition wall part 310 may include a UV resin or a transparent photoresist resin. Alternatively, the partition wall part 310 may include a urethane resin or an acrylic resin.

The accommodating part 320 may be formed to partially pass through the light conversion unit 300. Accordingly, the accommodating part 320 may be disposed to be in contact with the adhesive layer 410 and may be disposed to be spaced apart from the buffer layer 420. Accordingly, a base part 350 may be formed between the accommodating part 320 and the buffer layer 420.

The dispersion liquid 330b may disperse the light conversion particles 330a. The dispersion liquid 330b may include a transparent material. The dispersion liquid 330b may include a non-polar solvent. In addition, the dispersion liquid 330b may include a material capable of transmitting light. For example, the dispersion liquid 330b may include at least one of a halocarbon-based oil, a paraffin-based oil, and an isopropyl alcohol.

The light conversion particles 330a may be dispersed in the dispersion liquid 330b. Specifically, the plurality of light conversion particles 330a may be disposed in the dispersion liquid 330b to be spaced apart from each other.

The light conversion particle 330a may include a material capable of absorbing light. That is, the light conversion particle 330a may be a light absorbing particle. The light conversion particle 330a may have a color. For example, the light conversion particle 330a may have a black-based color. For example, the light conversion particle 330a may include carbon black particles.

The light conversion particle 330a may have a polarity because the surface thereof is charged. For example, a surface of the light conversion particle 330a may be charged with a negative (−) charge. Accordingly, the light conversion particle 330a may be moved toward the first electrode 210 or the second electrode 220 by the application of a voltage.

The light transmittance of the accommodating part 320 may be changed by the light conversion particles 330a. Specifically, the accommodating part 320 may be changed into a light blocking part and a light transmitting part by changing the light transmittance by the light conversion particle 330a. That is, the accommodating part 330a may change the light transmittance of passing through the accommodating part 320 by the dispersion and the aggregation of the light conversion particles 330a disposed in the dispersion liquid 330b.

For example, the optical path member according to the embodiment may be changed from a first mode to a second mode or from the second mode to the first mode by a voltage applied to the first electrode 210 and the second electrode 220.

Specifically, in the first mode, the accommodating part 320 becomes a light blocking part, and thus the accommodating part 320 may block light at a specific angle. Accordingly, since the viewing angle of the user is narrowed, the optical path control member may be driven in a privacy mode.

In addition, in the second mode, the accommodating part 320 becomes a light transmission part, and light may be transmitted from both the partition wall part 310 and the accommodating part 320. Accordingly, since the user's viewing angle is widened, the optical path control member may be driven in a publication mode.

Switching from the first mode to the second mode may be realized by the movement of the light conversion particles 330a in the accommodating part 320. That is, the light conversion particles 330a may have an electric charge on the surface thereof and may be moved toward the first electrode or the second electrode according to the characteristics of the electric charge.

For example, when a voltage is not externally applied to the optical path control member, the light conversion particle 330a of the accommodating part 320 may be uniformly dispersed in the dispersion liquid 330b. Accordingly, the light of the accommodating part 320 may be blocked by the light conversion particle 330a. Accordingly, the accommodating part 320 may be driven as a light blocking part in the first mode.

In addition, when a voltage is externally applied to the optical path control member, the light conversion particle 330a may be moved. For example, the light conversion particle 330a may be moved toward one end or the other end of the accommodating part 320 by a voltage transferred through the first electrode 210 and the second electrode 220. That is, the light conversion particle 330a may be moved toward the first electrode 210 or the second electrode 220.

For example, when a voltage is applied to the first electrode 210 and/or the second electrode 220, an electric field is formed between the first electrode 210 and the second electrode 220, and the light conversion particles 330a in a negatively charged state may be moved toward a positive electrode of the first electrode 210 and the second electrode 220 using the dispersion liquid 330b as a medium.

For example, when a voltage is not applied to the first electrode 210 and/or the second electrode 220 or when the optical path control member is operated in an initial mode, the light conversion particle 330a may be uniformly dispersed in the dispersion liquid 330b, as shown in FIG. 5. Accordingly, the accommodating part 320 may be driven as a light blocking part.

In addition, when a voltage is applied to the first electrode 210 and/or the second electrode 220, the light conversion particle 330a may be moved toward the second electrode 220 in the dispersion liquid 330b. That is, the light conversion particle 330a may be moved toward one direction. Accordingly, the accommodating part 320 may be driven as a light transmitting part.

Accordingly, the optical path control member according to an embodiment may be driven in two modes according to the user's surrounding environment, etc. That is, when the user wants light to be transmitted only at a specific viewing angle, the accommodating part may be driven as a light blocking part. Alternatively, in an environment in which a user requires a wide viewing angle and high luminance, a voltage may be applied to drive the accommodating part as a light transmitting part.

Accordingly, since the optical path control member according to the embodiment may be implemented in two modes according to the user's request, the optical path member may be applied regardless of the user's environment.

Referring to FIGS. 1, 4, 7, and 8, the optical path control member may include a sealing part. The sealing part may serve to seal a light conversion material disposed in the accommodating part 320 of the light conversion unit 300.

The sealing part may include a sealing part extending in a first direction 1D and a sealing part extending in a second direction 2D. For example, the sealing part may include a first sealing part 510 and a second sealing part 520 extending in a first direction 1D. The first sealing part 510 and the second sealing part 520 may be disposed to face each other in the second direction 2D.

In addition, the sealing part may include a third sealing part 530 and a fourth sealing part 540 extending in the second direction 2D. The third sealing part 530 and the fourth sealing part 540 may be disposed to face each other in the first direction 1D.

The first sealing part 510, the second sealing part 520, the third sealing part 530, and the fourth sealing part 540 may be disposed at an edge region of the optical path control member.

In addition, the first sealing part 510, the second sealing part 520, the third sealing part 530, and the fourth sealing part 540 may be disposed to be connected to each other. Specifically, the first sealing part 510, the second sealing part 520, the third sealing part 530, and the fourth sealing part 540 may be disposed to be connected to each other except for an open region OA. The open region OA may be a region for electrically connecting the second connection region CA2 and the second electrode 220.

The first sealing part 510, the second sealing part 520, the third sealing part 530, and the fourth sealing part 540 may be formed by filling a cutting region in the optical path control member 1000.

For example, the optical path control member 1000 may form a cutting region by completely or partially removing the second substrate 120, the second electrode 220, the buffer layer 420, and the light conversion unit 300. The first sealing part 510, the second sealing part 520, the third sealing part 530, and the fourth sealing part 540 may be disposed inside the cutting region.

Specifically, a light conversion material 330 may be injected into the accommodating part 320 through the cutting region, and then a sealing material may be disposed inside the cutting region for sealing. For example, a cutting region in which the first sealing part 510 is disposed may be an injection part for injecting a light conversion material. In addition, a cutting region in which the second sealing part 520 is disposed may be a suction part for sucking a light conversion material.

At least one sealing part of the first sealing part 510, the second sealing part 520, the third sealing part 530, and the fourth sealing part 540 may be directly exposed to an outermost surface of the optical path control member 1000. For example, the first sealing part 510 may be directly exposed to an outermost surface of the optical path control member 1000. That is, the outermost surface of the optical path control member 1000 may include the first sealing part 510. That is, the outermost surface of the optical path control member 1000 may be the first sealing part 510.

Any one of the first sealing part 510, the second sealing part 520, the third sealing part 530, and the fourth sealing part 540 may have a width smaller than that of the other sealing part. In detail, a width of the first sealing part 510 disposed at an outermost surface of the optical path control member 1000 may be smaller than widths of the second sealing part 520, the third sealing part 530, and the fourth sealing part 540.

That is, in order to form the first sealing part 510 to be disposed on the outermost side surface during the manufacturing process, the first sealing part 510 may be partially removed by cutting. Accordingly, the width of the first sealing part 510 may be smaller than the widths of the second sealing part 520, the third sealing part 530, and the fourth sealing part 540.

The first sealing part 510, the second sealing part 520, the third sealing part 530, and the fourth sealing part 540 may be disposed in contact with both ends of the accommodating part 320. Accordingly, the first sealing part 510, the second sealing part 520, the third sealing part 530, and the fourth sealing part 540 may inhibit the light conversion material 330 disposed inside the accommodating part 320 from flowing out of the accommodating part 320.

The first sealing part 510, the second sealing part 520, the third sealing part 530, and the fourth sealing part 540 may be disposed inside the accommodating part 320. Specifically, portions of the first sealing part 510, the second sealing part 520, the third sealing part 530, and the fourth sealing part 540 may be disposed inside the accommodating part 320.

Specifically, the first sealing part 510, the second sealing part 520, the third sealing part 530, and the fourth sealing part 540 are formed by injecting a sealing material into the cutting region and then curing the sealing material. Before the sealing material is cured, the sealing material has fluidity. Accordingly, the sealing material may penetrate into the accommodating part while pushing the light conversion material disposed inside the accommodating part.

Accordingly, some regions of the first sealing part 510, the second sealing part 520, the third sealing part 530, and the fourth sealing part 540 formed by curing the sealing material may be inserted into the accommodating part 320.

Accordingly, the sealing parts can effectively inhibit impurities from penetrating into the accommodating part 320.

In the following description, a sealing material disposed and cured in the cutting region is defined as a first sealing region 511, a second sealing region 521, a third sealing region 531, and a fourth sealing region 541, and a sealing material cured in the accommodating part 320 is defined as a first anchor region 512, a second anchor region 522, a third anchor region 532, and a fourth anchor region 542, respectively.

Specifically, the first sealing part 510 includes ae first sealing region 511 and a first anchor region 512, the second sealing part 520 includes a second sealing region 521 and a second anchor region 522, the third sealing part 530 includes a third sealing region 531 and a three anchor region 532, and the fourth sealing part 530 includes a fourth sealing region 541 and a fourth anchor region 542.

Each sealing region and each anchor region may be connected to each other. In detail, each sealing region and each anchor region may be integrally formed.

Two of the first anchor region 512, the second anchor region 522, the third anchor region 532, and the fourth anchor region 542 may be disposed in each of the accommodating parts.

Sizes of the third anchor region 532 and the fourth anchor region 542 may vary according to positions of the third anchor region 532 and the fourth anchor region 542.

Sizes of the third anchor region 532 and the fourth anchor region 542 may be defined as a first length L1 and a second length L2. Specifically, the first length L1 is defined as a length in a first direction 1D from an interface IS of the sealing region and the anchor region to an end of the anchor region. In addition, the second length L2 is defined as a length in a length direction of the accommodating part from an interface IS of the sealing region and the anchor region to an end of the anchor region.

That is, a first length L1 of the third anchor region 532 is defined as the length in the first direction 1D from an interface IS of the third sealing region 531 and the third anchor region 532 to the end of the third anchor region 532. In addition, a second length L2 of the third anchor region 532 is defined as the length in the length direction of the accommodating part 320 from the interface IS of the third sealing region 531 and the third anchor region 532 to the end of the third anchor region 532.

In addition, a first length L1 of the fourth anchor region 542 is defined as a length in the first direction 1D from the interface IS of the fourth sealing region 541 and the fourth anchor region 542 to the end of the fourth anchor region 542. In addition, a second length L2 of the fourth anchor region 542 is defined as a length in the length direction of the accommodating part 320 from the interface IS of the fourth sealing region 541 and the fourth anchor region 542 to the end of the fourth anchor region 542.

Referring to FIGS. 9 to 14, the first sealing part 510, the second sealing part 520, the third sealing part 530, and the fourth sealing part 540 may be disposed in a cutting region, respectively. Specifically, the first sealing region 511, the second sealing region 521, the third sealing region 531, and the fourth sealing region 541 may be disposed in a cutting region, respectively.

The cutting region may be formed by partially cutting the optical path control member. Specifically, the first sealing region 511 and the second sealing region 521 are disposed inside a cutting region extending in the first direction 1D. In addition, the third sealing region 531 and the fourth sealing region 541 are disposed inside a cutting region extending in the second direction 2D.

The cutting region may be formed by removing at least one of the second substrate 120, the second electrode 220, the buffer layer 420, and the light conversion unit 300. Specifically, the cutting region may be formed by removing the second substrate 120, the second electrode 220, the buffer layer 420, and the light conversion unit 300.

Accordingly, the cutting region may be connected to the accommodating part 320. The sealing material injected through the cutting region may form a sealing region disposed inside the cutting region and an anchor region disposed inside the accommodating part 320.

Referring to FIGS. 7 to 14, the sizes (a first length and a second length) of the third anchor region 532 and the fourth anchor region 542 may vary while extending in a second direction 2D.

Figure 7:
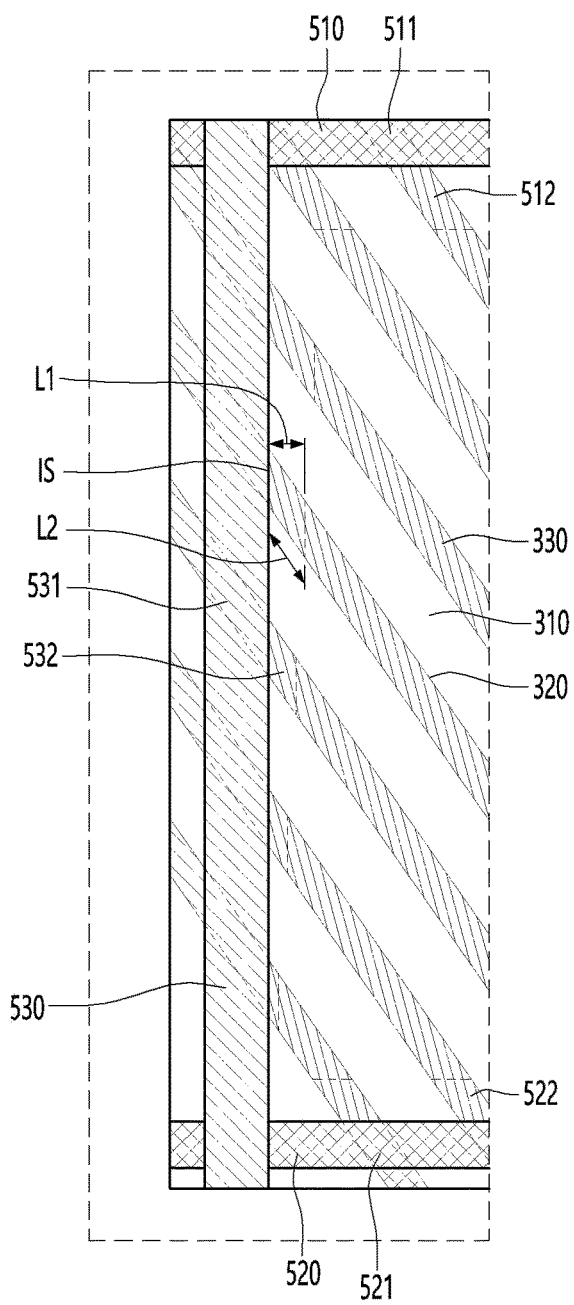
FIG. 7 is a diagram showing an enlarged view of region A of FIG. 4.
Figure 8:
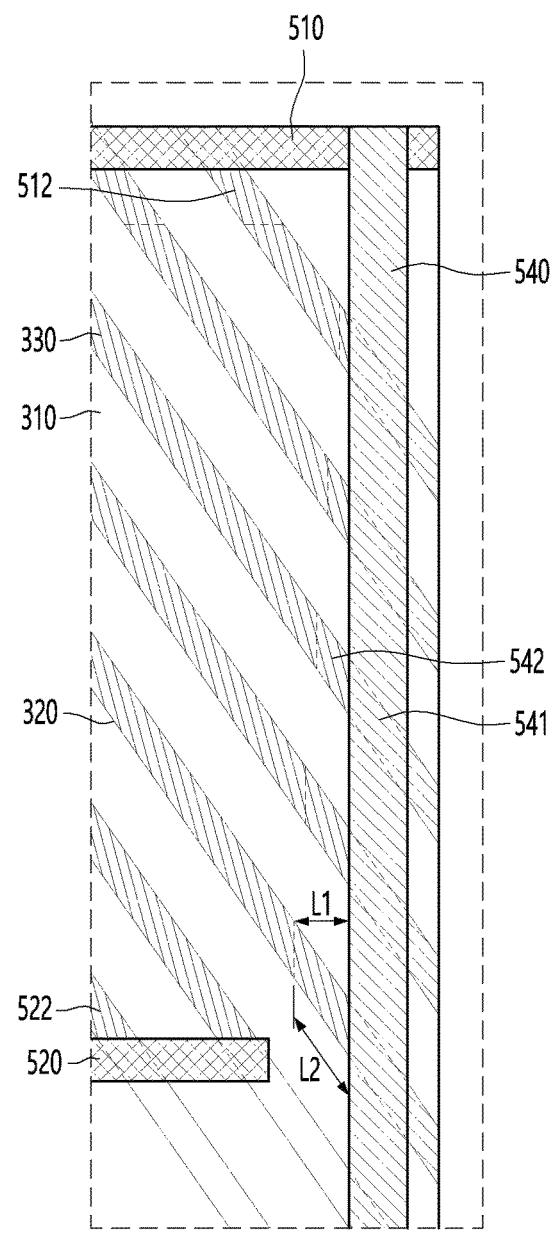
FIG. 8 is a diagram showing an enlarged view of region B of FIG. 4.
Figure 9:
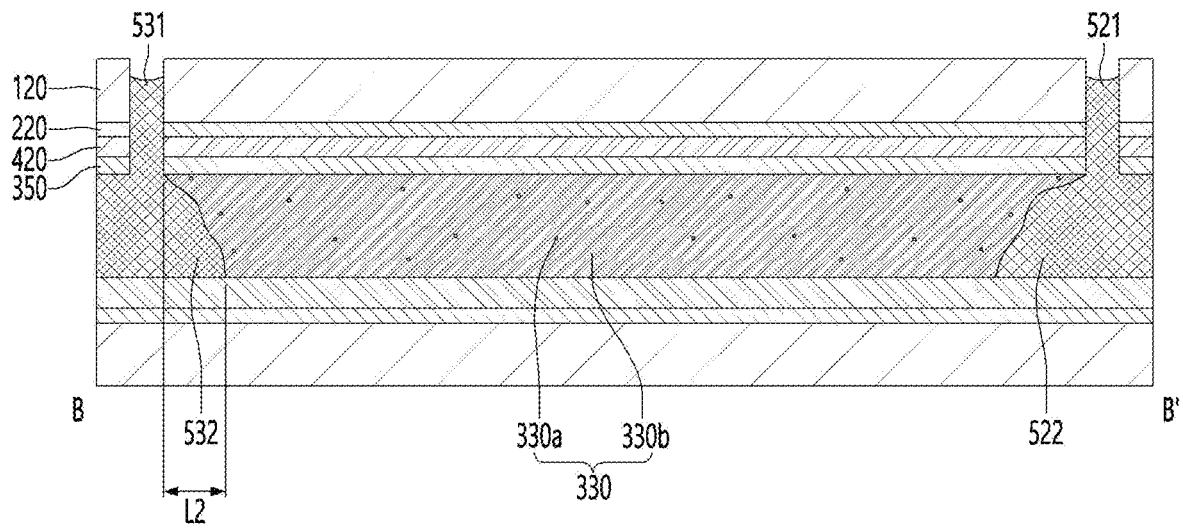
FIG. 9 is a cross-sectional view taken along a B-B' region of FIG. 4.
Figure 10:
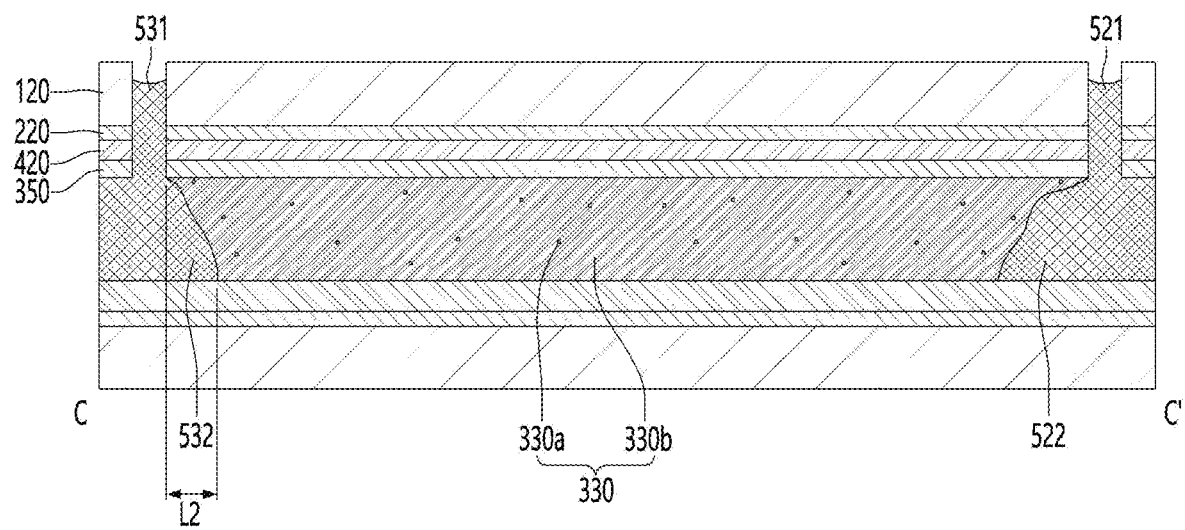
FIG. 10 is a cross-sectional view taken along a C-C' region of FIG. 4.
Figure 11:
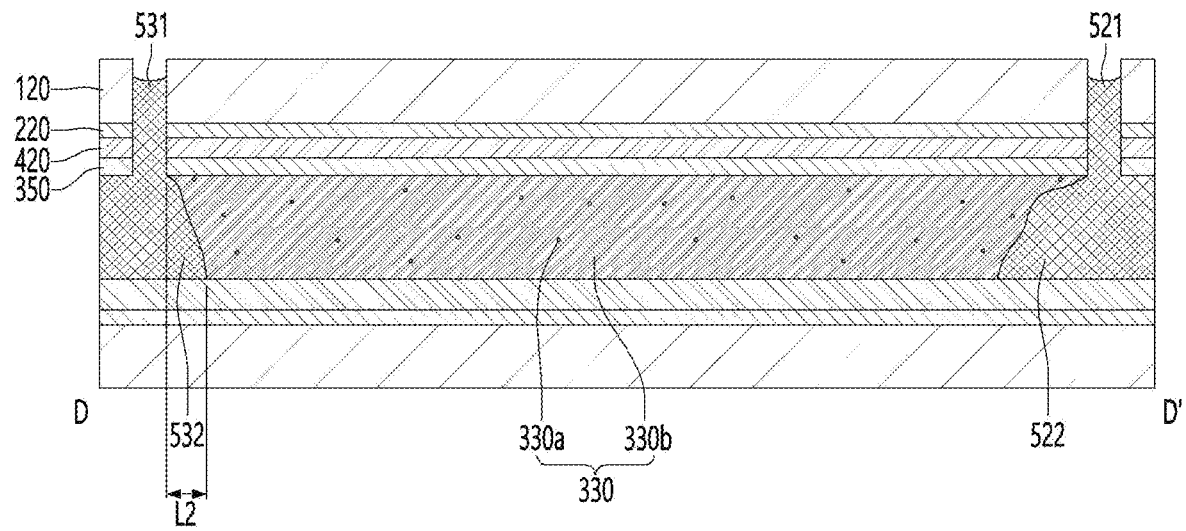
FIG. 11 is a cross-sectional view taken along a D-D' region of FIG. 4.
Figure 12:
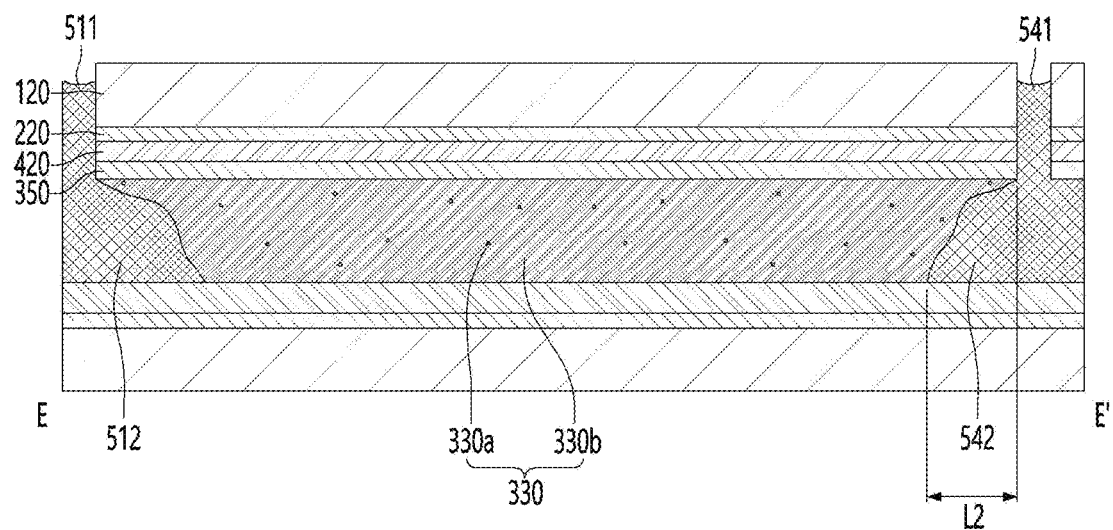
FIG. 12 is a cross-sectional view taken along a E-E' region of FIG. 4.
Figure 13:
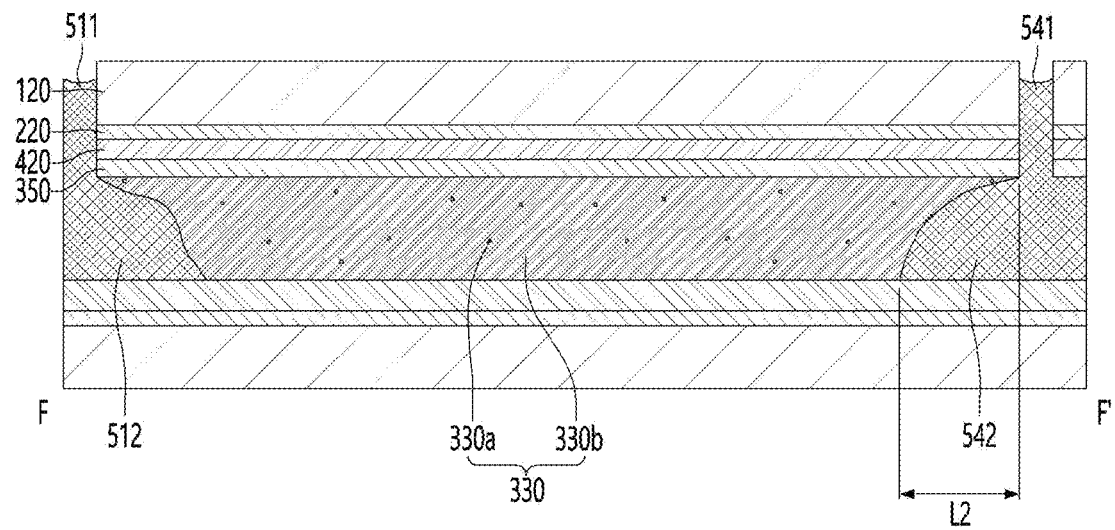
FIG. 13 is a cross-sectional view taken along a F-F' region of FIG. 4.
Figure 14:
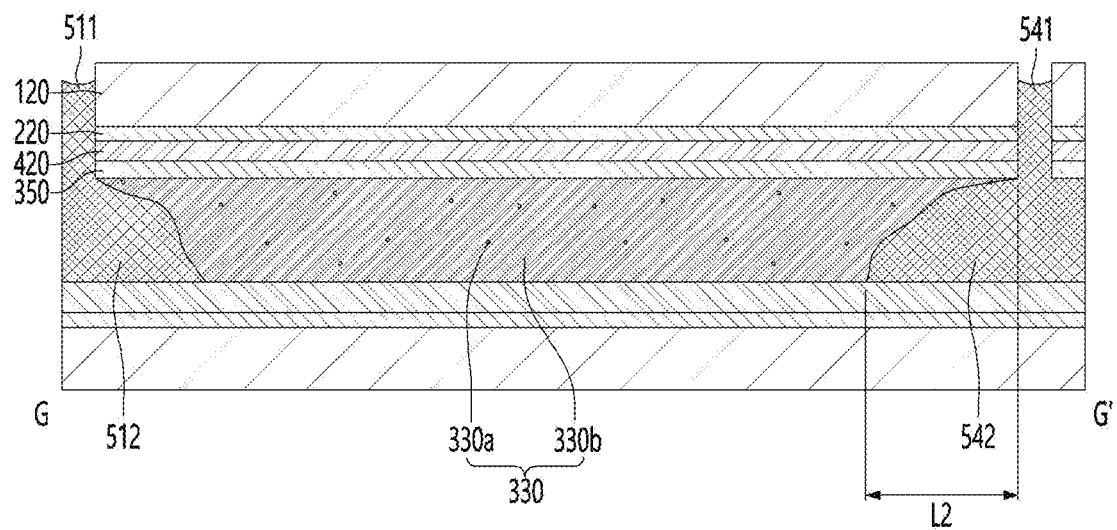
FIG. 14 is a cross-sectional view taken along a G-G' region of FIG. 4.

Specifically, referring to FIG. 7, the size of the third anchor region 532 may gradually decrease while extending from the first sealing part 510 to the second sealing part 520. In addition, the size of the fourth anchor region 542 may gradually increase while extending from the first sealing part 510 to the second sealing part 520.

Referring to FIGS. 7 and 9 to 11, the size of the third anchor region 532 may gradually decrease while extending from the first sealing part 510 to the second sealing part 520.

Specifically, the first length L1 of the third anchor region 532 may gradually decrease while extending from the first sealing part 510 to the second sealing part 520. In addition, the second length L2 of the third anchor region 532 may gradually decrease while extending from the first sealing part 510 to the second sealing part 520.

The first and second lengths L1 and L2 of the third anchor region 532 are related to a length of the accommodating part 320 in which the third anchor region 532 is disposed. Specifically, the first and second lengths L1 and L2 of the third anchor region 532 may be proportional to a length of the accommodating part 320 in which the third anchor region 532 is disposed.

The length of the accommodating part 320 in which the third anchor region 532 is disposed gradually decreases while extending from the first sealing part 510 to the second sealing part 520. Accordingly, the length of the third anchor region 532 may gradually decrease while extending from the first sealing part 510 to the second sealing part 52.

The first and second lengths of the third anchor region 532 may have predetermined ranges. For example, the first length L1 of the third anchor region 532 may range from 30 μm to 1000 μm. Also, the second length L2 of the third anchor region 532 may range from 50 μm to 1500 μm.

The first and second lengths of the range of the third anchor region 532 may gradually become longer while extending from the first sealing part 510 to the second sealing part 52 within the range.

Referring to FIGS. 8 and 12 to 14, the size of the fourth anchor region 542 may gradually increase while extending from the first sealing part 510 to the second sealing part 520.

Specifically, the first length L1 of the fourth anchor region 542 may gradually increase while extending from the first sealing part 510 to the second sealing part 520. Also, the second length L2 of the fourth anchor region 542 may gradually increase while extending from the first sealing part 510 to the second sealing part 520.

The first and second lengths L1 and L2 of the fourth anchor region 542 are related to a length of the accommodating part 320 in which the fourth anchor region 542 is disposed. Specifically, the first and second lengths L1 and L2 of the fourth anchor region 542 may be proportional to a length of the accommodating part 320 in which the fourth anchor region 542 is disposed.

The length of the accommodating part 320 in which the fourth anchor region 542 is disposed may gradually increase while extending from the first sealing part 510 to the second sealing part 520. Accordingly, the length of the fourth anchor region 542 may also gradually increase while extending from the first sealing part 510 to the second sealing part 52.

Specifically, the length of the fourth anchor region 542 may increase as it approaches the first connection region CA1 and the second connection region CA2.

The first and second lengths of the fourth anchor region 542 may have set ranges. For example, the first length L1 of the fourth anchor region 542 may range from 30 μm to 1000 μm. In addition, the second length L2 of the fourth anchor region 542 may range from 50 μm to 1500 μm.

The first length and the second length of the range of the fourth anchor region 542 may be gradually shortened while extending from the first sealing part 510 to the second sealing part 52 within the range.

Meanwhile, the first sealing part 510 and the second sealing part 520 may also include a sealing region and an anchor region, respectively. In this case, the sizes of the anchor regions of the first sealing part 510 and the second sealing part 520 may be different from the sizes of the anchor regions of the third sealing part 530 and the fourth sealing part 540.

In detail, the first and second lengths of the anchor regions of the first sealing part 510 and the second sealing part 520 may be greater than the first and second lengths of the anchor regions of the third sealing part 530 and the fourth sealing part 540. In detail, the first and second lengths of the anchor regions of the first sealing part 510 and the second sealing part 520 may be 2 to 5 times the first and second lengths of the anchor regions of the third sealing part 530 and the fourth sealing part 540.

As described above, the first sealing part 510 may be an outermost side surface of the optical path control member. Accordingly, the first sealing part 510 may be more vulnerable to moisture penetration than other sealing parts. Accordingly, moisture penetration through the first sealing part 510 may be effectively inhibited by increasing the anchor region size of the first sealing part 510.

In addition, the second sealing part 520 may be disposed closer to the first connection region CA1 and the second connection region CA2 than other sealing parts. Accordingly, when a defect occurs in the second sealing part 520, a light conversion material may be disposed outside the second sealing part 520. Accordingly, a light conversion material may penetrate into the first connection region CA1 and the second connection region CA2.

Accordingly, the sealing characteristics of the second sealing part 510 can be improved by increasing the size of the anchor region of the first sealing part 510. Accordingly, reliability of the optical path control member may be improved.

Hereinafter, an optical path control member according to another embodiment will be described with reference to FIGS. 15 to 17. In the description of the optical path control member according to another embodiment, descriptions similar to those of the optical path control member according to the previously described embodiment will be omitted, and identical components will be assigned the same reference numerals.

Figure 15:
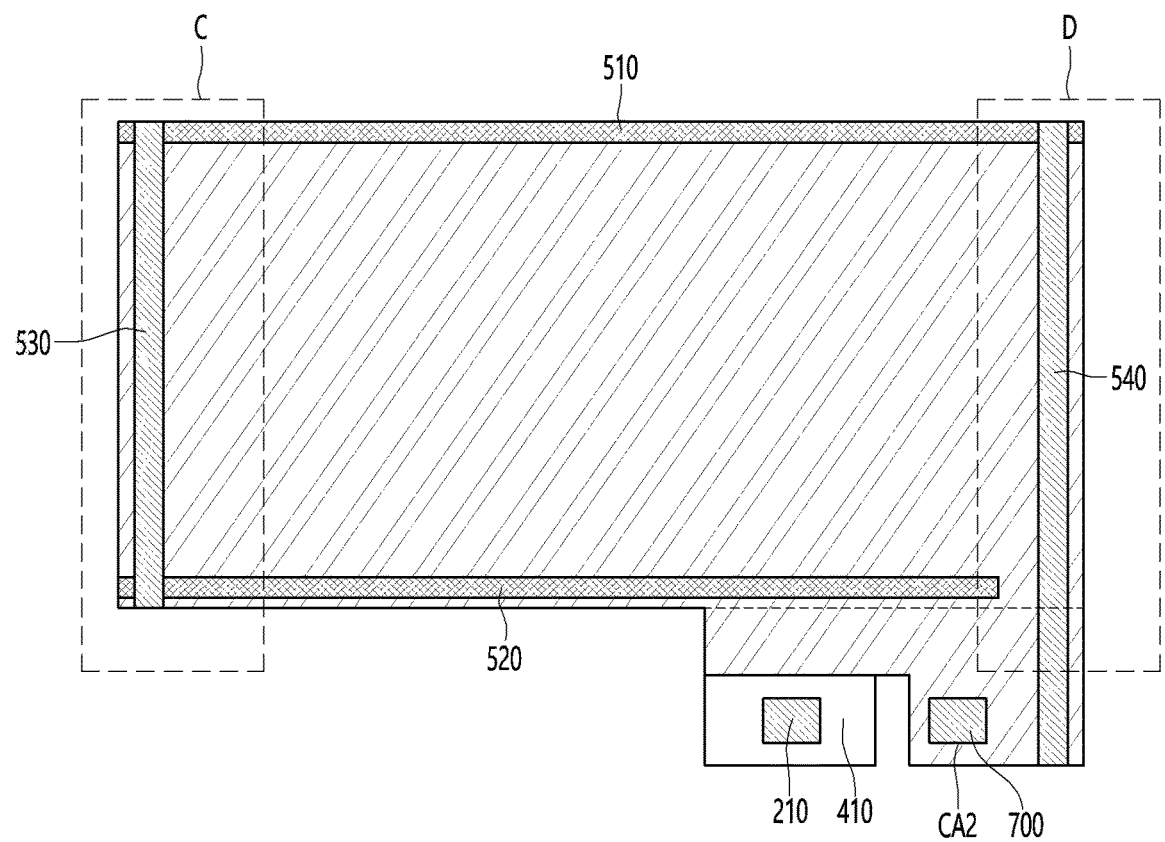
FIG. 15 is a top view of a second substrate in a state in which the first and second substrates of an optical path control member according to another embodiment are laminated.
Figure 16:
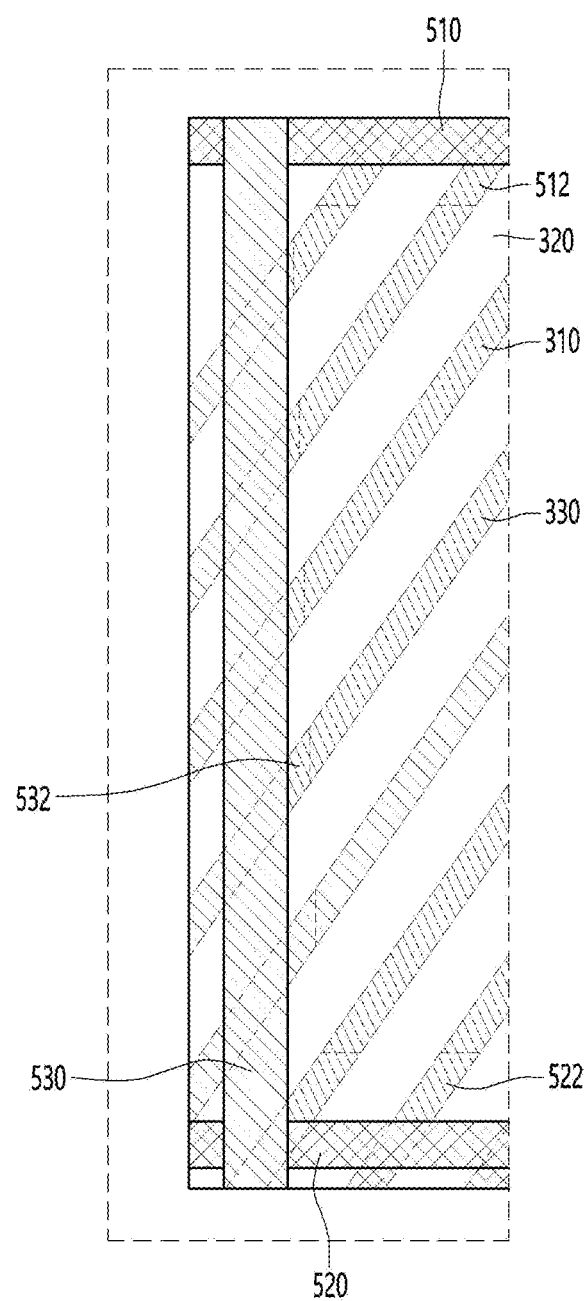
FIG. 16 is an enlarged view of region C of FIG. 15.
Figure 17:
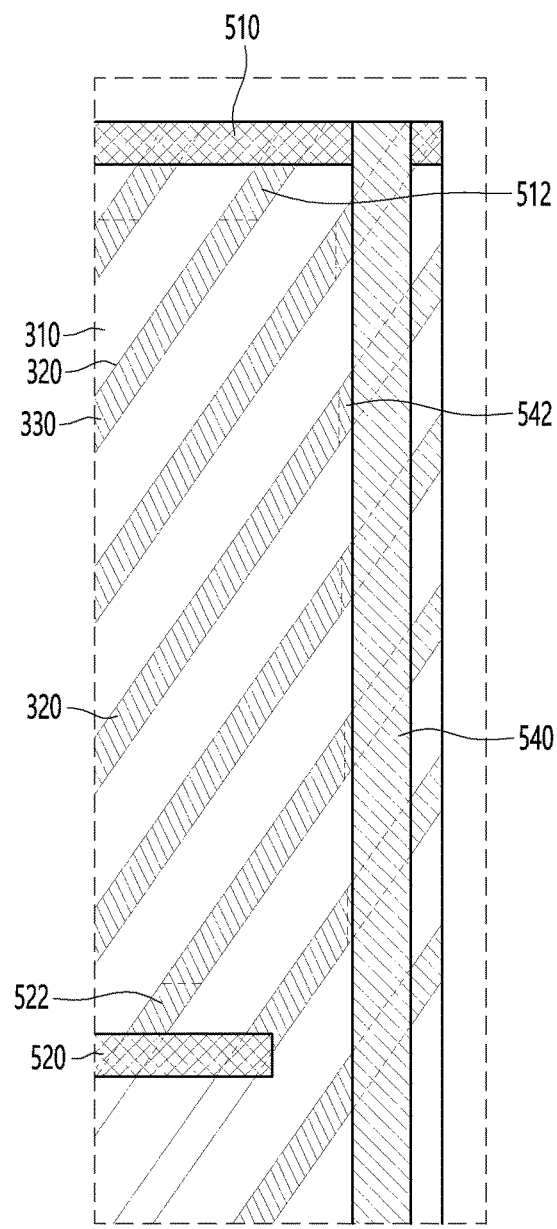
FIG. 17 is an enlarged view of region D of FIG. 15.

Referring to FIGS. 15 to 17, the accommodating part 320 may extend in a direction different from the first and second directions 1D and 2D. That is, the accommodating part 320 may be tilted with respect to the first and second directions 1D and 2D. For example, the accommodating part 320 may extend in a direction between the first and second directions 1D and 2D.

Specifically, at least one of the accommodating parts 430 may be in contact with the first sealing part 510 and the second sealing part 520. In addition, at least one other accommodating part among the accommodating parts may be in contact with the first sealing part 510 and the third sealing part 530. In addition, at least one other accommodating part among the accommodating parts may be in contact with the second sealing part 520 and the fourth sealing part 540. Accordingly, the accommodating part 430 can be arranged extending in the fourth-second direction.

Referring to FIGS. 16 and 17, the size of the third anchor region 532 may gradually increase while extending from the first sealing part 510 to the second sealing part 520.

Specifically, the first length L1 of the third anchor region 532 may gradually increase while extending from the first sealing part 510 to the second sealing part 520. In addition, the second length L2 of the third anchor region 532 may gradually increase while extending from the first sealing part 510 to the second sealing part 520.

In addition, the first length L1 of the fourth anchor region 542 may gradually decrease while extending from the first sealing part 510 to the second sealing part 520. In addition, the second length L2 of the fourth anchor region 542 may gradually decrease while extending from the first sealing part 510 to the second sealing part 520.

In the optical path control member according to the embodiment, the accommodating part is disposed tilted with respect to the length and width directions of the optical path control member, so that the accommodating part can be sealed by different sealing parts.

In addition, the first sealing part, the second sealing part, the third sealing part, and the fourth sealing part each include an anchor region inserted and placed inside the accommodating part.

The anchor region may protect a light conversion material disposed inside the accommodating part. That is, when moisture flows into the accommodating part from the outside of the optical path control member, the penetration of the moisture may be inhibited by an anchor region disposed inside the accommodating part.

Accordingly, it is possible to inhibit stains formed by the reaction of light conversion material with moisture penetrating into the accommodating part. In addition, it is possible to inhibit a decrease in the efficiency of the light conversion material due to a change in the properties of the light conversion material.

Accordingly, the optical path control member according to an embodiment may have improved reliability.

In addition, the third sealing part and the fourth sealing part have anchor regions having different sizes. That is, a length of the anchor region of the third sealing part may increase while extending in one direction. In addition, a length of the anchor region of the fourth sealing part may decrease while extending in another direction opposite to one direction.

Accordingly, the optical path control member according to an embodiment includes regions having different lengths of anchor regions. Thus, the optical path control member may be applied using various methods. In addition, a length of an inactive region in which the light conversion material is not disposed may be minimized.

Specifically, a greater anchor region is more effective in inhibiting moisture from penetrating than a smaller anchor region. Accordingly, when the optical path control member and another member are connected, moisture penetration may be inhibited even when the sealing part is exposed to the outside in the region having a greater anchor region.

In addition, a smaller anchor region has a greater light conversion area than a greater anchor region. Accordingly, when the optical path control member and another member are connected, the light conversion efficiency may be maintained even if the accommodating part is partially covered in a smaller anchor region.

In addition, the size of the anchor region of the fourth sealing part may increase while extending from the first sealing part to the second sealing part. That is, the size of the anchor region of the fourth sealing part may increase as it approaches the connection region.

Accordingly, it is possible to inhibit moisture from penetrating toward the connection region through the fourth sealing part close to the connection region.

Accordingly, the reliability of the optical path control member can be improved.

Hereinafter, an optical path control member according to another embodiment is to be described with reference to FIGS. 18 and 19. In the description of the optical path control member according to another embodiment, descriptions similar to those of the optical path control member according to the previously described embodiment will be omitted, and identical components will be assigned the same reference numerals.

The third anchor region 532 may have a deviation within a set range. Specifically, the third anchor region 532 gradually decreases from the first sealing part 510 toward the second sealing part 520, and the third anchor regions 532 may have a length deviation within a set range.

For example, the first length L1 of the third anchor region 532 may have a deviation of 100 μm or less. Specifically, the first length L1 of the third anchor region 532 may have a deviation of 10 μm to 100 μm. More specifically, the first length L1 of the third anchor region 532 may have a deviation of 20 μm to 90 μm. More specifically, the first length L1 of the third anchor region 532 may have a deviation of 30 μm to 80 μm. More specifically, the first length L1 of the third anchor region 532 may have a deviation of 40 μm to 50 μm.

The deviation of the first length L1 of the third anchor region 532 and the deviation of the first length L1 of the fourth anchor region 542 may be different from each other. Specifically, the deviation of the first length L1 of the third anchor region 532 may be smaller than the deviation of the first length L1 of the fourth anchor region 542.

In addition, the second length L2 of the third anchor region 532 may have a deviation of 500 μm or less. Specifically, the second length L2 of the third anchor region 532 may have a deviation of 100 μm to 500 μm. More specifically, the second length L2 of the third anchor region 532 may have a deviation of 150 μm to 450 μm. More specifically, the second length L2 of the third anchor region 532 may have a deviation of 200 μm to 300 μm.

The deviation of the second length L2 of the third anchor region 532 and the deviation of the second length L2 of the third anchor region 532 may be different from each other. Specifically, the deviation of the second length L2 of the third anchor region 532 may be smaller than the deviation of the second length L2 of the fourth anchor region 542.

Figure 18:
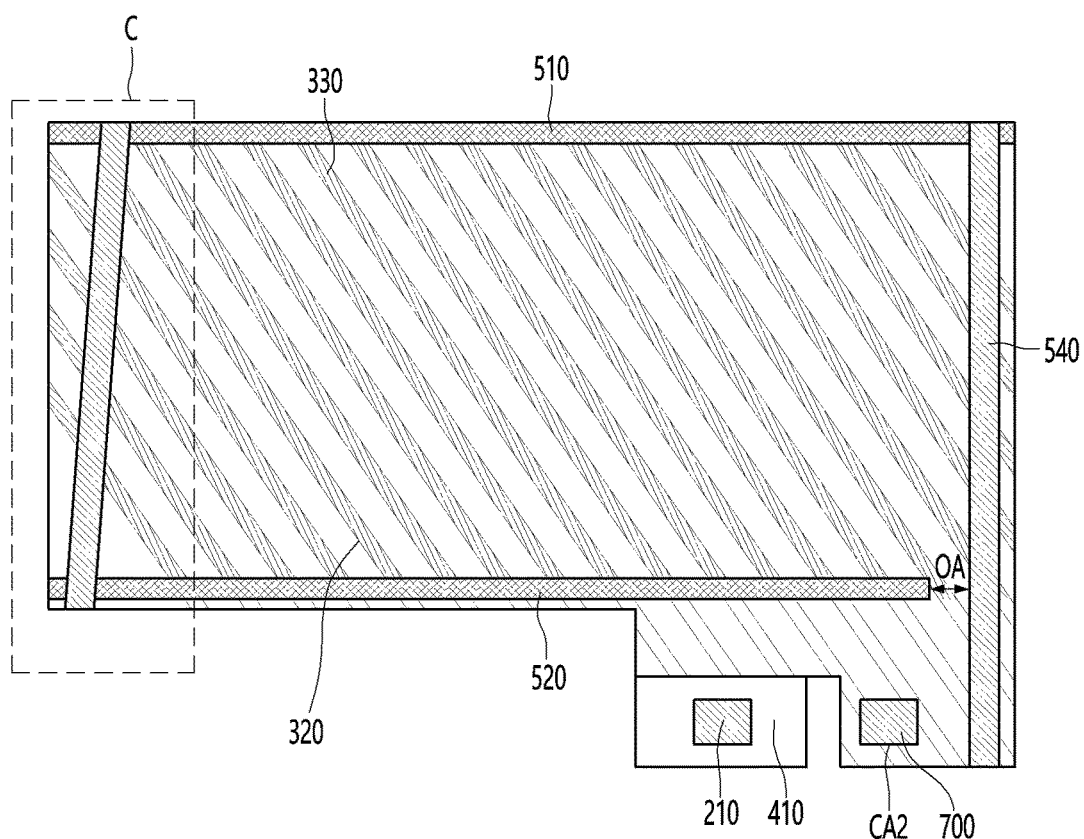
FIG. 18 is a top view of a second substrate in a state in which the first and second substrates of an optical path control member according to another embodiment are laminated.
Figure 19:
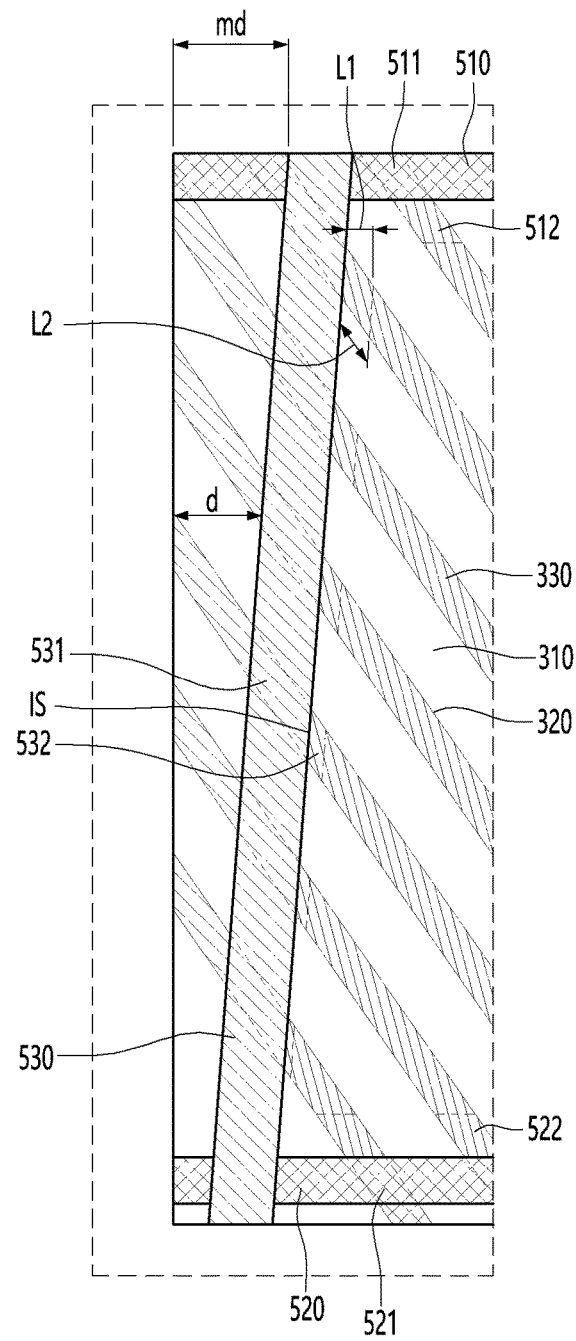
FIG. 19 is an enlarged view of region C of FIG. 18.

Referring to FIGS. 18 and 19, the third sealing part 530 may extend in a direction different from the first and second directions 1D and 2D. That is, the third sealing part 540 may extend in the fourth-first direction.

Specifically, the third sealing part 530 may extend in a direction in which the distance (d) between the third sealing part 530 and the end of the optical path control member becomes smaller as it extends from the first sealing part 510 toward the second sealing part 520.

That is, the third sealing part 530 may extend in the fourth-first direction in which the distance between the third sealing part 530 and the end of the optical path control member decreases while extending from the first sealing part 510 to the second sealing part 520.

The third sealing part 530 may be disposed to be spaced apart from the end of the optical path control member by a set range. Specifically, a maximum distance md between the third sealing part 530 and the end of the optical path control member may be 10 mm or less. More specifically, the maximum distance md between the third sealing part 530 and the end of the optical path control member may be 1 mm to 10 mm.

When the maximum distance md between the third sealing part 530 and the end of the optical path control member exceeds 10 mm, a light conversion region that is an effective region of the optical path control member may be reduced by an increase in a tilting angle of the fourth sealing part 540. Alternatively, the overall size of the optical path control member may be increased to compensate for the reduction problem described above.

The first and second lengths of the third anchor region 532 of the third sealing part 530 may be related to a length of the accommodating part 320 in which the third anchor region 532 is disposed. Specifically, the first and second lengths of the third anchor region 532 may be proportional to the length of the accommodating part 320 in which the third anchor region 532 is disposed.

That is, the first length of the third anchor region 532 may be longer as the length of the accommodating part 320 is longer, and the second length of the third anchor region 532 may be longer as the length of the accommodating part 320 is longer.

As the accommodating part 320 is tilted and disposed with respect to the first direction 1D and the second direction 2D, the lengths of the accommodating parts 320 in which the third anchor region 532 is disposed may vary.

That is, the lengths of the accommodating parts 320 in which the third anchor region 532 is disposed may be reduced while extending from the first sealing part 510 to the second sealing part 520. Therefore, the lengths of the third anchor regions 532 disposed in each accommodating part may also be reduced while extending from the first sealing part 510 to the second sealing part 520.

Accordingly, a length deviation of the third anchor region 532 may occur. That is, the first length and the second length of the third anchor region 532 may decrease while extending from the first sealing part 510 to the second sealing part 520.

The optical path control member according to the embodiment may reduce the length deviation of the third anchor region 532 by extending the third sealing part 530 in a fourth-first direction tilted with respect to the first direction 1D and the second direction 2D.

That is, the third sealing part 530 is disposed to extend in the fourth-first direction, and accordingly, the length of the accommodating part 320 in which the third anchor region 532 is disposed may be reduced. Specifically, a reduction ratio of the length of the accommodating part 320 in which the third anchor region 532 is disposed may gradually decrease while extending from the first sealing part 510 toward the second sealing part 520.

Therefore, among the accommodating parts 320 in which the third anchor region 532 is disposed, the length of the accommodating part 320 with a relatively small length can be reduced slightly, and the length of the accommodating part 320 with a relatively large length can be greatly reduced.

Accordingly, a size deviation of the third anchor region 532 proportional to the length of the accommodating part 320 may be reduced.

Therefore, the optical path control member according to the embodiment may effectively inhibit moisture that may penetrate into the accommodating part by forming an anchor region in the third sealing part and the fourth sealing part, respectively.

In addition, it is possible to minimize the reduction in the size of the light conversion region by reducing the deviation of the anchor region in at least one of the third sealing part and the fourth sealing part.

Hereinafter, an optical path control member according to another embodiment will be described with reference to FIGS. 20 and 21. In the description of the optical path control member according to another embodiment, descriptions similar to those of the optical path control member according to the previously described embodiment will be omitted, and identical components will be assigned the same reference numerals.

The fourth anchor region 542 may have a deviation within a set range. Specifically, the fourth anchor region 542 gradually increases from the first sealing part 510 toward the second sealing part 520, and in this case, the fourth anchor regions 542 may have a length deviation within a set range.

For example, the first length L1 of the fourth anchor region 542 may have a deviation of 100 µm or less. Specifically, the first length L1 of the fourth anchor region 542 may have a deviation of 10 µm to 100 µm. More specifically, the first length L1 of the fourth anchor region 542 may have a deviation of 20 µm to 90 µm. More specifically, the first length L1 of the fourth anchor region 542 may have a deviation of 30 µm to 80 µm. More specifically, the first length L1 of the fourth anchor region 542 may have a deviation of 40 µm to 50 µm.

The deviation of the first length L1 of the third anchor region 532 and the deviation of the first length L1 of the fourth anchor region 542 may be different from each other. Specifically, the deviation of the first length L1 of the fourth anchor region 542 may be smaller than the deviation of the first length L1 of the third anchor region 532.

In addition, the second length L2 of the fourth anchor region 542 may have a deviation of 500 µm or less. Specifically, the second length L2 of the fourth anchor region 542 may have a deviation of 100 µm to 500 µm. More specifically, the second length L2 of the fourth anchor region 542 may have a deviation of 150 µm to 450 µm. More specifically, the second length L2 of the fourth anchor region 542 may have a deviation of 200 µm to 300 µm.

The deviation of the second length L2 of the third anchor region 532 and the deviation of the second length L2 of the fourth anchor region 542 may be different from each other. Specifically, the deviation of the second length L2 of the fourth anchor region 542 may be less than the deviation of the second length L2 of the third anchor region 532.

Figure 20:
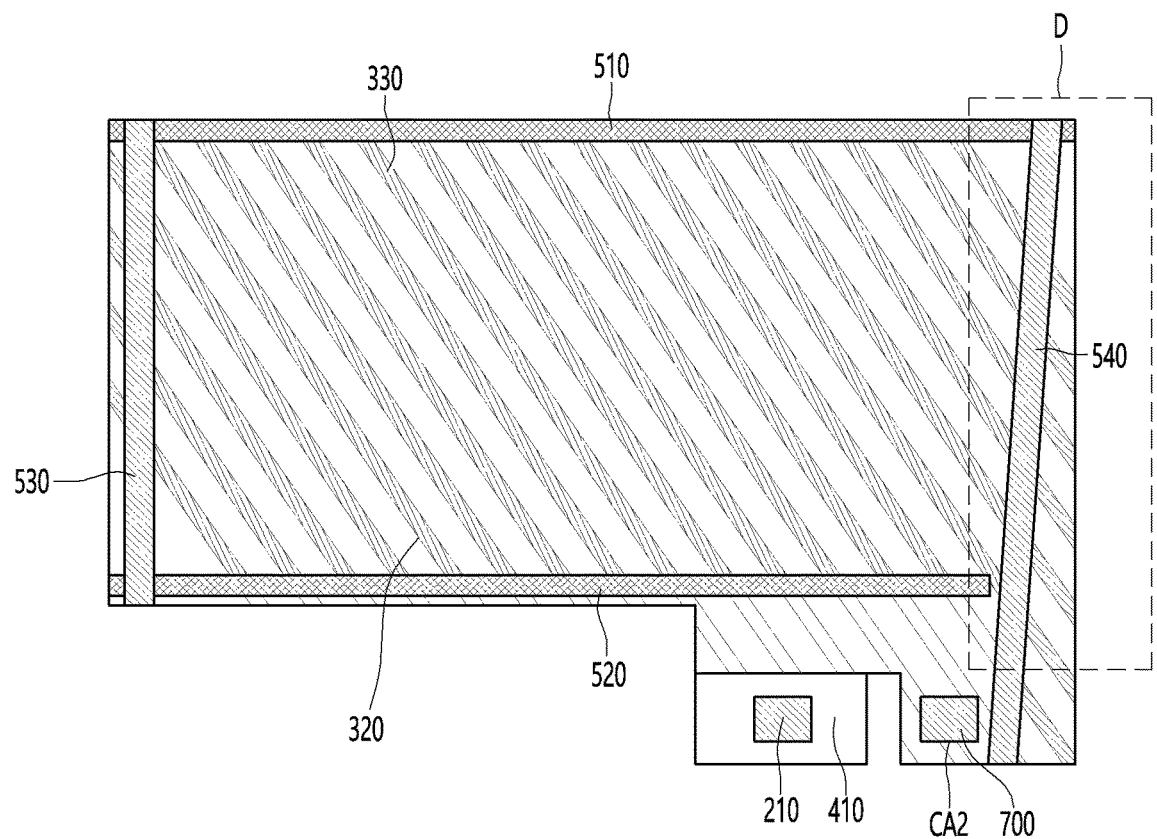
FIG. 20 is a top view of a second substrate in a state in which the first and second substrates of an optical path control member according to another embodiment are laminated.
Figure 21:
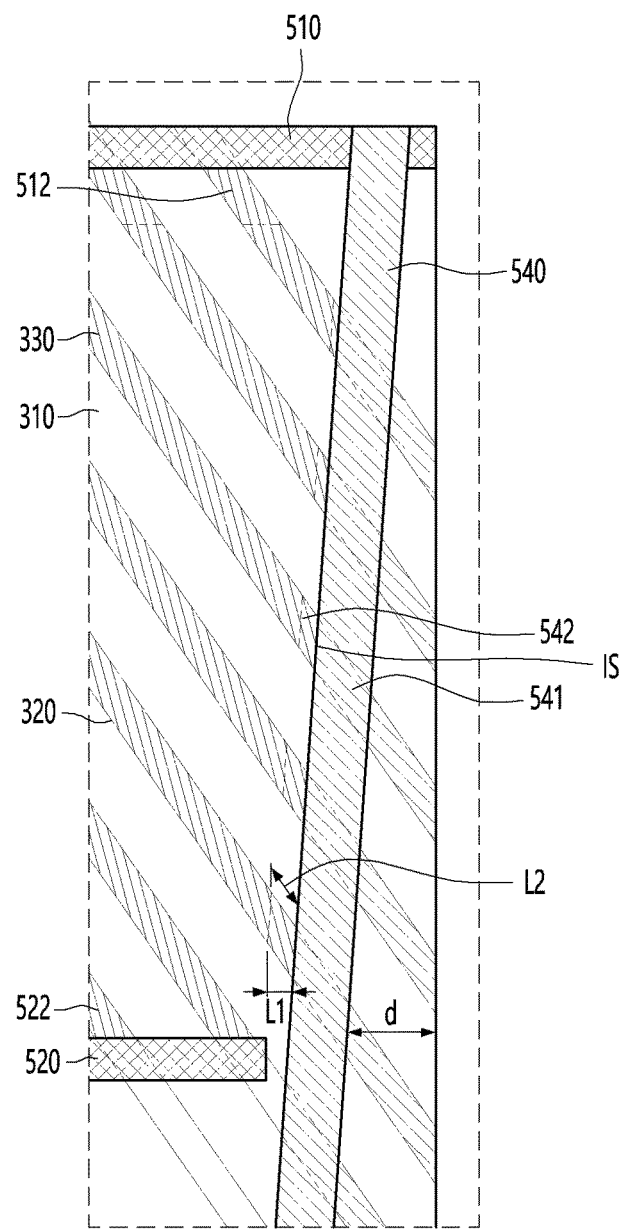
FIG. 21 is an enlarged view of region D of FIG. 20.

Referring to FIGS. 20 and 21, the fourth sealing part 540 may extend in a direction different from the first direction 1D and the second direction 2D. That is, the third sealing part 530 may extend in the fourth-first direction.

Specifically, the fourth sealing part 540 may extend in a direction in which the distance (d) between the fourth sealing part 540 and the end of the optical path control member becomes greater as it extends from the first sealing part 510 toward the second sealing part 520.

That is, the fourth sealing part 540 may extend in the fourth-first direction in which the distance between the fourth sealing part 540 and the end of the optical path control member increases while extending from the first sealing part 510 to the second sealing part 520.

The fourth sealing part 540 may be disposed to be spaced apart from the end of the optical path control member by a set range. Specifically, a maximum distance md between the fourth sealing part 540 and the end of the optical path control member may be 10 mm or less. More specifically, the maximum distance md between the fourth sealing part 540 and the end of the optical path control member may be 1 mm to 10 mm.

When the maximum distance (md) between the fourth sealing part 540 and the end of the optical path control member exceeds 10 mm, an increase in a tilting angle of the fourth sealing part 540 may reduce the light conversion region, which is the effective region of the light path control member, or increase the overall size of the light path control member to compensate for the decrease.

The first and second lengths of the fourth anchor region 542 of the fourth sealing part 530 may be related to the length of the accommodating part 320 in which the fourth anchor region 542 is disposed. Specifically, the first and second lengths of the fourth anchor region 542 may be proportional to the length of the accommodating part 320 in which the fourth anchor region 542 is disposed.

That is, the first length of the fourth anchor region 542 may be longer as the length of the accommodating part 320 is longer, and the second length of the fourth anchor region 542 may be longer as the length of the accommodating part 320 is longer.

As the accommodating part 320 is tilted with respect to the first direction 1D and the second direction 2D, the lengths of the accommodating parts 320 in which the fourth anchor region 542 is disposed may vary.

That is, the length of the accommodating parts 320 in which the fourth anchor region 542 is disposed may increase while extending from the first sealing part 510 to the second sealing part 520. Accordingly, the length of the fourth anchor region 542 disposed in each accommodating part may also increase while extending from the first sealing part 510 to the second sealing part 520.

Accordingly, a length deviation of the fourth anchor region 542 may occur. That is, the first and second lengths of the fourth anchor region 542 may increase while extending from the first sealing part 510 to the second sealing part 520.

The optical path control member according to the embodiment may extend and arrange the fourth sealing part 540 in a fourth-first direction tilted with the first direction 1D and the second direction 2D, thereby reducing the length deviation of the fourth anchor region 542.

That is, since the fourth sealing part 540 is disposed extending in the fourth-first direction, the lengths of the accommodating parts 320 in which the fourth anchor region 542 is disposed may be reduced. Specifically, a length reduction ratio of the accommodating parts 320 in which the fourth anchor region 542 is disposed may gradually increase while extending from the first sealing part 510 to the second sealing part 520.

Therefore, among the accommodating parts 320 in which the fourth anchor region 542 is disposed, the length of the accommodating part 320 with a relatively small length can be reduced slightly, and the length of the accommodating part 320 with a relatively large length can be greatly reduced.

Accordingly, the size deviation of the fourth anchor region 542 proportional to the length of the accommodating part 320 may be reduced.

Therefore, the optical path control member according to the embodiment may effectively inhibit moisture that may penetrate into the accommodating part by forming an anchor region in the third sealing part and the fourth sealing part, respectively.

In addition, it is possible to minimize the reduction in the size of the light conversion region by reducing the deviation of the anchor region in at least one of the third sealing part and the fourth sealing part.

In addition, the size of the anchor region of the fourth sealing part is larger in regions close to the first connection region and the second connection region, and accordingly, it can minimize the infiltration of moisture into the connection region through the fourth sealing part.

Hereinafter, an optical path control member according to another embodiment will be described with reference to FIG. 22. In the description of the optical path control member according to another embodiment, descriptions similar to those of the optical path control member according to the previously described embodiment will be omitted, and identical components will be assigned the same reference numerals.

Figure 22:
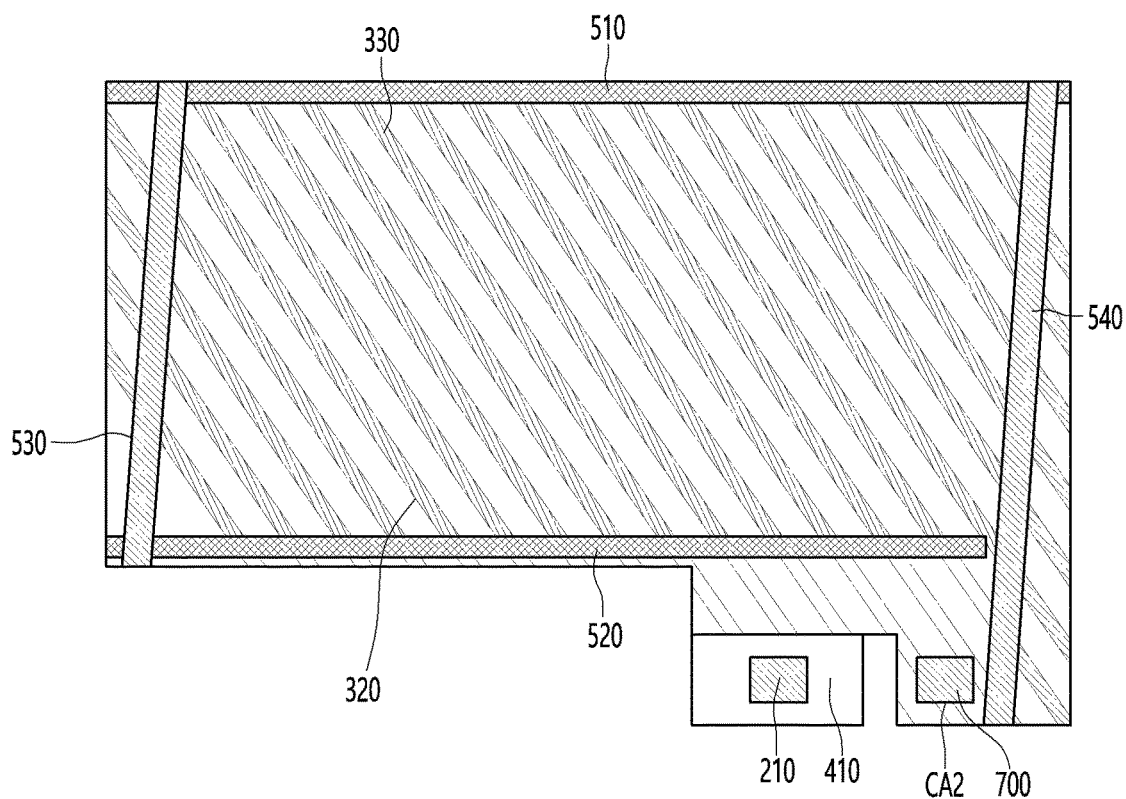
FIG. 22 is a top view of a second substrate in a state in which the first and second substrates of an optical path control member according to another embodiment are laminated.

Referring to FIG. 22, the third sealing part 530 and the fourth sealing part 540 may extend in different directions from the first and second directions 1D and 2D. Specifically, each of the third sealing part 530 and the fourth sealing part 540 may extend in a fourth-first direction.

Specifically, the third sealing part 530 may extend in a direction in which the distance (d) between the third sealing part 530 and the end of the optical path control member decreases while extending from the first sealing part 510 to the second sealing part 520.

That is, the third sealing part 530 may extend in the fourth-first direction in which the distance between the third sealing part 530 and the end of the optical path control member decreases while extending from the first sealing part 510 to the second sealing part 520.

In addition, the fourth sealing part 530 may extend in a direction in which the distance between the fourth sealing part 540 and the end of the optical path control member increases while extending from the first sealing part 510 to the second sealing part 520.

That is, the fourth sealing part 540 may extend in the fourth-first direction in which the distance between the fourth sealing part 540 and the end of the optical path control member increases while extending from the first sealing part 510 to the second sealing part 520.

The third sealing part 530 and the fourth sealing part 540 may be disposed to be spaced apart from each other within a set range of the end of the optical path control member. Specifically, a maximum distance md between the third sealing part 540 and the end of the optical path control member and a maximum distance md between the fourth sealing part 540 and the end of the optical path control member may be 10 mm or less. More specifically, the maximum distance md between the third sealing part 530 and the end of the optical path control member and the maximum distance md between the fourth sealing part 540 and the end of the optical path control member may be 1 mm to 10 mm.

When the maximum distance md between the third sealing part 530 and the end of the optical path control member and the maximum distance md between the fourth sealing part 540 and the end of the optical path control member exceed 10 mm, an increase in tilting angles of the third sealing part 530 and the fourth sealing part 540 may reduce the light conversion region, which is the effective region of the light path control member, or increase the overall size of the light path control member to compensate for the decrease.

The optical path control member according to the embodiment may extend and arrange the third sealing part 530 and the fourth sealing part 540 in a fourth-first direction tilted with respect to the first direction 1D and the second direction 2D, thereby reducing both length deviations of the third anchor region 532 and the fourth anchor region 542.

Therefore, the optical path control member according to the embodiment may effectively inhibit moisture that may penetrate into the accommodating part by forming an anchor region in the third sealing part and the fourth sealing part, respectively.

In addition, it is possible to minimize the reduction in the size of the light conversion region by reducing the deviation of the anchor region of the third sealing part and the deviation of the anchor region of the fourth sealing part.

Hereinafter, an optical path control member according to another embodiment will be described with reference to FIG. 23. In the description of the optical path control member according to another embodiment, descriptions similar to those of the optical path control member according to the previously described embodiment will be omitted, and identical components will be assigned the same reference numerals.

Figure 23:
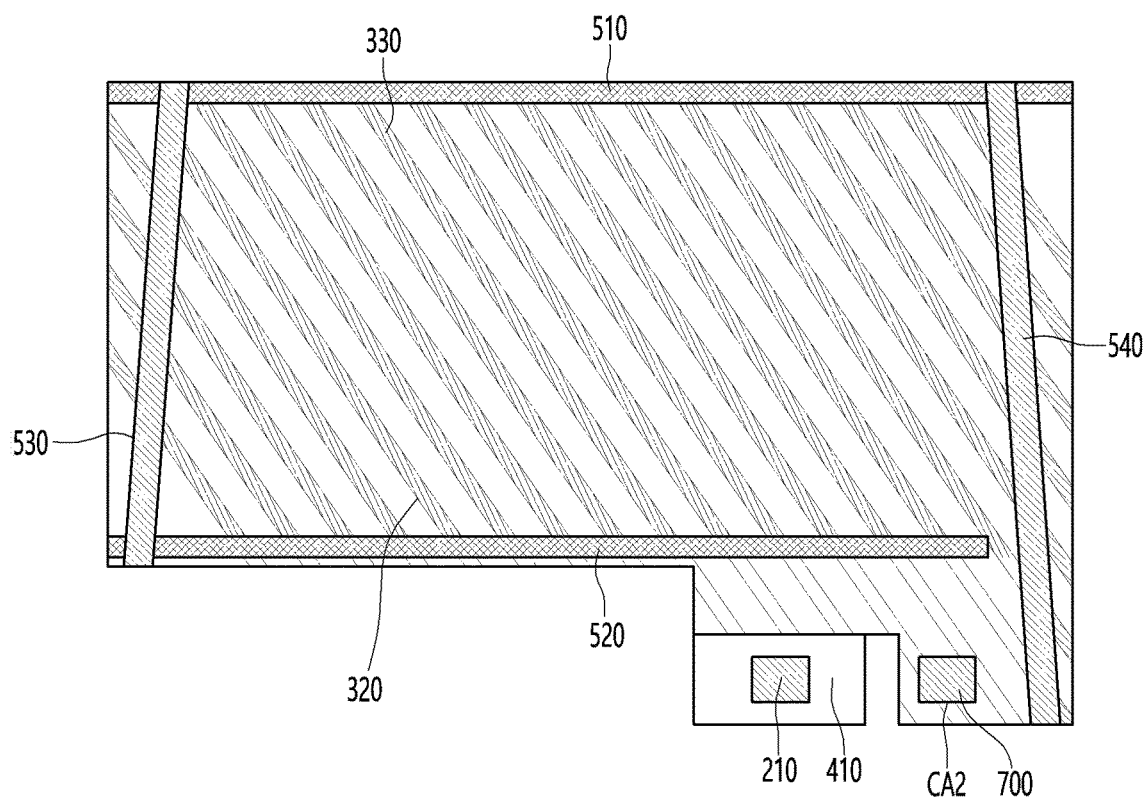
FIG. 23 is a top view of a second substrate in a state in which the first and second substrates of an optical path control member according to another embodiment are laminated.

Referring to FIG. 23, the third sealing part 530 and the fourth sealing part 540 may extend in different directions from the first and second directions 1D and 2D. Specifically, the third sealing part 530 may extend in a fourth-first direction, and the fourth sealing part 540 may extend in a fourth-second direction. That is, the third sealing part 530 and the fourth sealing part 540 may be disposed to extend in different directions.

Specifically, the third sealing part 530 may extend in a direction in which the distance (d) between the third sealing part 530 and the end of the optical path control member decreases while extending from the first sealing part 510 to the second sealing part 520.

That is, the third sealing part 530 may extend in the fourth-first direction in which the distance between the third sealing part 530 and the end of the optical path control member decreases while extending from the first sealing part 510 to the second sealing part 520.

In addition, the fourth sealing part 540 may extend in a direction in which the distance between the fourth sealing part 540 and the end of the optical path control member decreases while extending from the first sealing part 510 to the second sealing part 520.

That is, the fourth sealing part 540 may extend in the fourth-second direction in which the distance between the fourth sealing part 540 and the end of the optical path control member decreases while extending from the first sealing part 510 to the second sealing part 520.

The third sealing part 530 and the fourth sealing part 540 may be disposed to be spaced apart from each other in a set range from the end of the optical path control member. Specifically, a maximum distance md between the third sealing part 540 and the end of the optical path control member and a maximum distance md between the fourth sealing part 540 and the end of the optical path control member may be 10 mm or less. More specifically, a maximum distance md between the third sealing part 530 and the end of the optical path control member and a maximum distance md between the fourth sealing part 540 and the end of the optical path control member may be 1 mm to 10 mm.

When the maximum distance md between the third sealing part 530 and the end of the optical path control member and the maximum distance md between the fourth sealing part 540 and the end of the optical path control member exceed 10 mm, an increase in tilting angles of third sealing part 530 and the fourth sealing part 540 may reduce the light conversion region, which is the effective region of the light path control member, or increase the overall size of the light path control member to compensate for the decrease.

The deviation of the first length L1 of the third anchor region 532 may be different from the deviation of the first length L1 of the fourth anchor region 542. Specifically, the deviation of the first length L1 of the third anchor region 532 may be smaller than the deviation of the first length L1 of the fourth anchor region 542.

The deviation of the second length L2 of the third anchor region 532 and the deviation of the second length L2 of the fourth anchor region 542 may be different from each other. Specifically, the deviation of the second length L2 of the third anchor region 532 may be smaller than the deviation of the second length L2 of the fourth anchor region 542.

The optical path control member according to the embodiment extends the third sealing part 530 and the fourth sealing part 540 in the fourth-first and fourth-second directions tilted with respect to the first direction 1D and the second direction 2D, and accordingly, the length deviation of any one of the third anchor region 532 and the fourth anchor region 542 may be reduced.

In addition, the optical path control member according to the embodiment can effectively inhibit moisture that can penetrate into the accommodating part by forming anchor regions in the third sealing part and the fourth sealing part, respectively.

In addition, it is possible to minimize the reduction in the size of the light conversion region by reducing the deviation of the anchor region of at least one of the third sealing part or the fourth sealing part.

In addition, the third sealing part 530 and the fourth sealing part 540 may be disposed to extend in different directions. Accordingly, the effective region of the optical path control member may be formed in a trapezoidal shape with the upper and lower surfaces having different lengths.

Accordingly, the shape of the effective region may be changed into various shapes according to the tilting angle of the sealing part, and the optical path control member may be applied to a display device having a screen of various shapes.

Hereinafter, an optical path control member according to another embodiment will be described with reference to FIG. 24. In the description of the optical path control member according to another embodiment, descriptions similar to those of the optical path control member according to the previously described embodiment will be omitted, and identical components will be assigned the same reference numerals.

Figure 24:
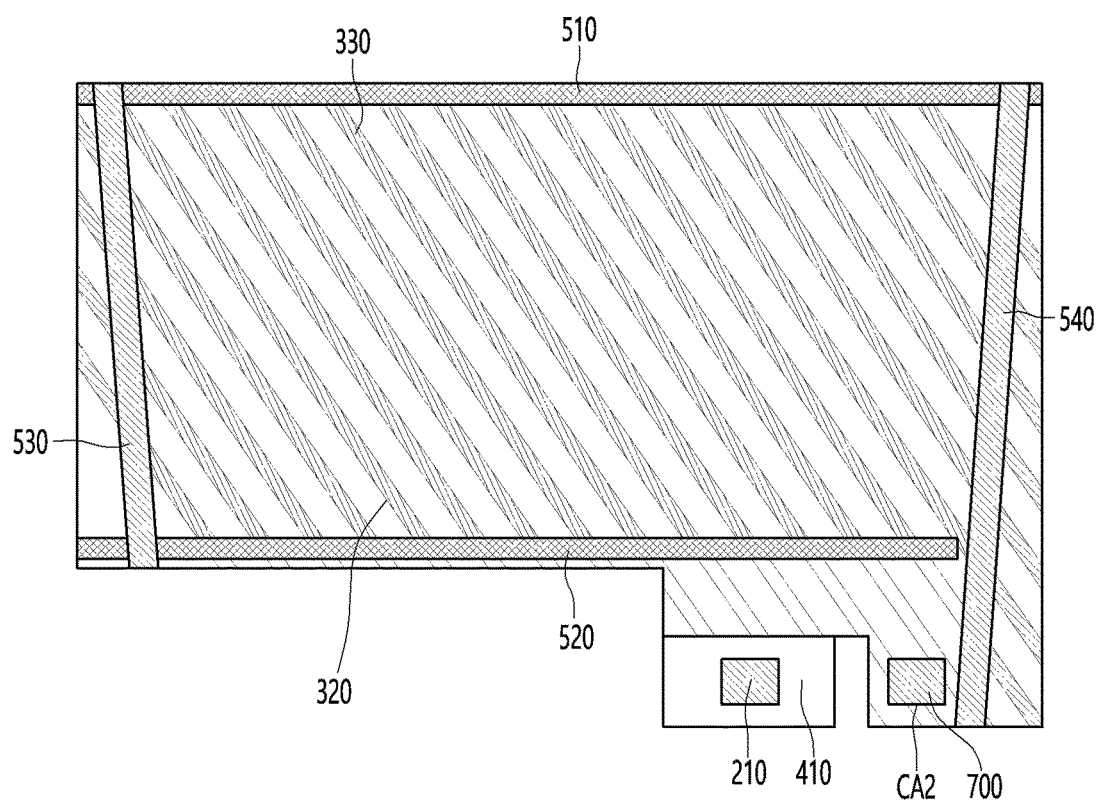
FIG. 24 is a top view of a second substrate in a state in which the first and second substrates of an optical path control member according to another embodiment are laminated.

Referring to FIG. 24, the third sealing part 530 and the fourth sealing part 540 may extend in a direction different from the first and second directions 1D and 2D. Specifically, the third sealing part 530 may extend in a fourth-second direction, and the fourth sealing part 540 may extend in a fourth-first direction. That is, the third sealing part 530 and the fourth sealing part 540 may be disposed to extend in different directions.

Specifically, the third sealing part 530 may extend in a direction in which the distance (d) between the third sealing part 530 and the end of the optical path control member increases while extending from the first sealing part 510 to the second sealing part 520.

That is, the third sealing part 530 may extend in the fourth-second direction in which the distance between the third sealing part 530 and the end of the optical path control member increases while extending from the first sealing part 510 to the second sealing part 520.

In addition, the fourth sealing part 530 may extend in which the distance (d) between the fourth sealing part 540 and the end of the optical path control member increases while extending from the first sealing part 510 to the second sealing part 520.

That is, the fourth sealing part 540 may extend in the fourth-first direction in which the distance between the fourth sealing part 540 and the end of the optical path control member increases while extending from the first sealing part 510 to the second sealing part 520.

The third sealing part 530 and the fourth sealing part 540 may be disposed to be spaced apart from each other in a set range from the end of the optical path control member. Specifically, a maximum distance md between the third sealing part 540 and the end of the optical path control member and a maximum distance md between the fourth sealing part 540 and the end of the optical path control member may be 10 mm or less. More specifically, a maximum distance md between the third sealing part 530 and the end of the optical path control member and a maximum distance md between the fourth sealing part 540 and the end of the optical path control member may be 1 mm to 10 mm.

When the maximum distance md between the third sealing part 530 and the end of the optical path control member and the maximum distance md between the fourth sealing part 540 and the end of the optical path control member exceed 10 mm, an increase in tilting angles of the third sealing part 530 and the fourth sealing part 540 may reduce the light conversion region, which is the effective region of the light path control member, or increase the overall size of the light path control member to compensate for the decrease.

The deviation of the first length L1 of the third anchor region 532 and the deviation of the first length L1 of the fourth anchor region 542 may be different from each other. Specifically, the deviation of the first length L1 of the third anchor region 532 may be smaller than the deviation of the first length L1 of the fourth anchor region 542.

The deviation of the second length L2 of the third anchor region 532 and the deviation of the second length L2 of the fourth anchor region 542 may be different from each other. Specifically, the deviation of the second length L2 of the third anchor region 532 may be smaller than the deviation of the second length L2 of the fourth anchor region 542.

The optical path control member according to the embodiment extends the third sealing part 530 and the fourth sealing part 540 in the fourth-first and fourth-second directions tilted with respect to the first direction 1D and the second direction 2D, and accordingly, the length deviation of the third anchor region 532 and the fourth anchor region 542 may be reduced.

In addition, the optical path control member according to the embodiment can effectively inhibit moisture that can penetrate into the accommodating part by forming anchor regions in the third sealing part and the fourth sealing part, respectively.

In addition, it is possible to minimize the reduction in the size of the light conversion region by reducing the deviation of the anchor region of at least one of the third sealing part or the fourth sealing part.

In addition, the third sealing part 530 and the fourth sealing part 540 may be disposed to extend in different directions. Accordingly, the effective region of the optical path control member may be formed in a trapezoidal shape with the upper and lower surfaces having different lengths.

Accordingly, the shape of the effective region may be changed into various shapes according to the tilting angle of the sealing part, and the optical path control member may be applied to a display device having a screen of various shapes.

Hereinafter, an optical path control member according to another embodiment will be described with reference to FIGS. 24 and 26. In the description of the optical path control member according to another embodiment, descriptions similar to those of the optical path control member according to the previously described embodiment will be omitted, and identical components will be assigned the same reference numerals.

Figure 25:
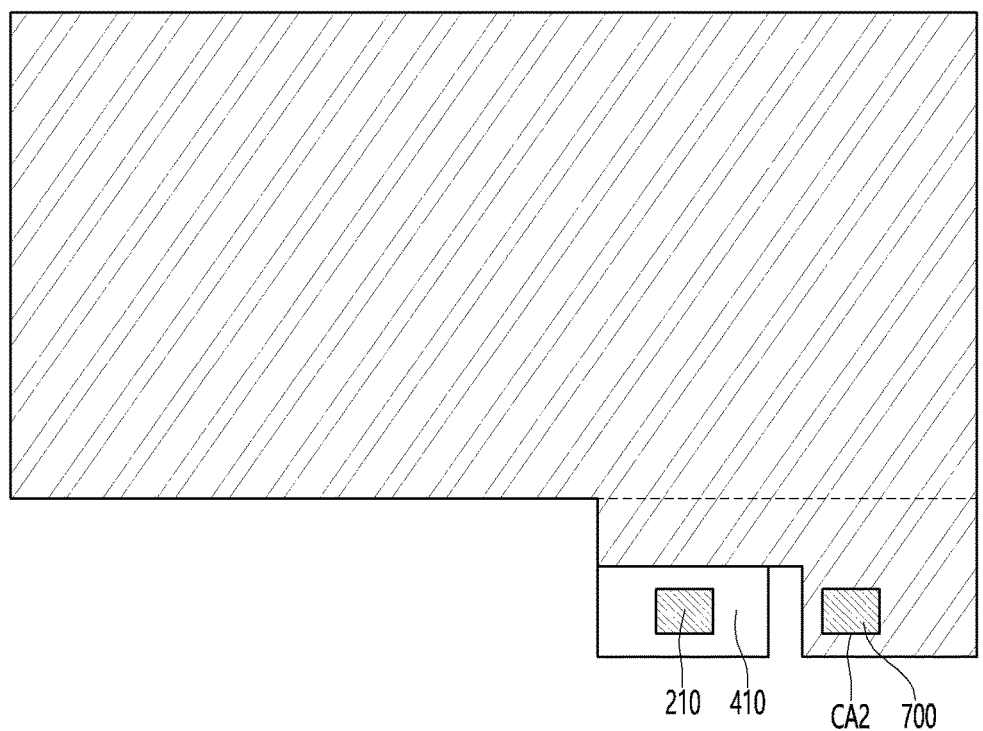
FIG. 25 is a top view of a second substrate of an optical path control member according to another embodiment.

Referring to FIG. 25, the accommodating part 320 may be disposed to extend in one direction. Specifically, the accommodating part 320 may be disposed by being tilted at a certain angle.

For example, the accommodating part 320 may extend in a direction different from the first and second directions 1D and 2D of the first substrate 110 or the second substrate 120.

That is, the accommodating part 320 may be tilted and extended with respect to the first and second directions 1D and 2D. For example, the accommodating part 320 may extend in a direction between the first and second directions 1D and 2D.

Specifically, the accommodating part 320 may extend in a direction where both ends of the accommodating part 320 meet the first sealing part 510 and the second sealing part 520, both ends of the accommodating part 320 meet the first sealing part 510 and the third sealing part 530, and both ends of the accommodating part 320 meet the second sealing part 520 and the fourth sealing part 540.

Figure 26:
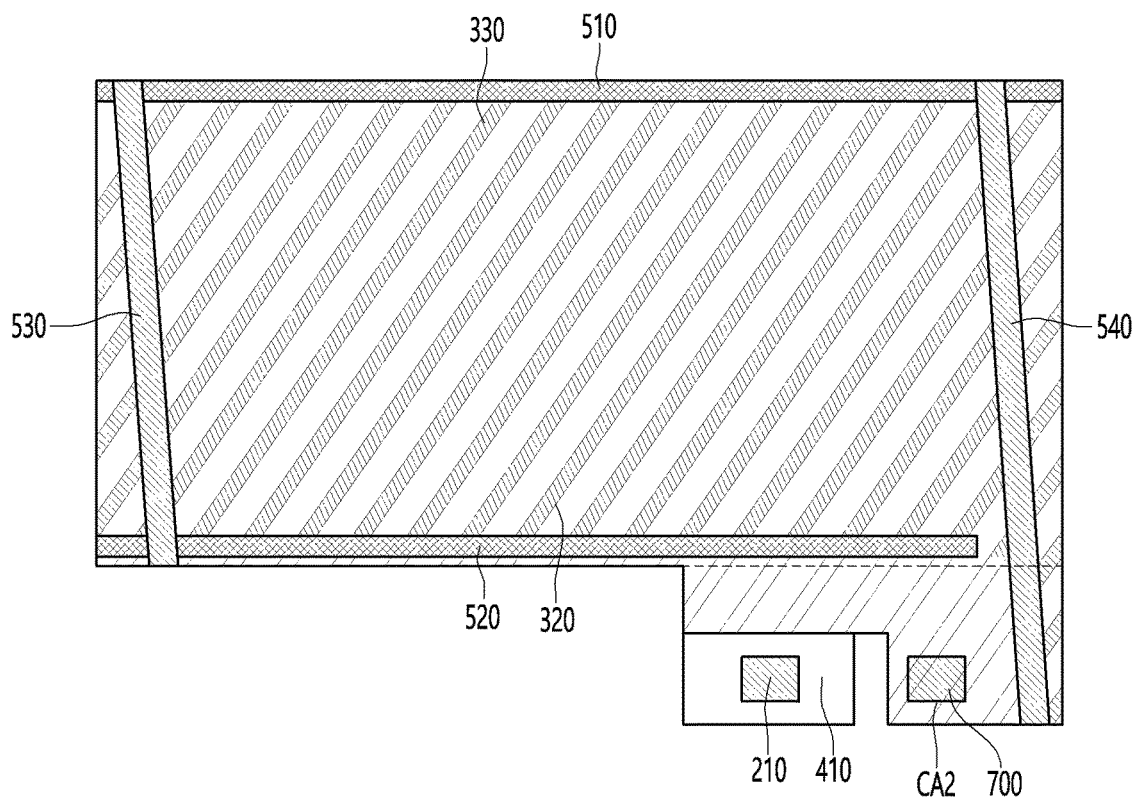
FIG. 26 is a top view of a second substrate in a state in which the first and second substrates of an optical path control member according to another embodiment are laminated.

Referring to FIG. 26, the third sealing part 530 and the fourth sealing part 540 may extend in a direction different from the first and second directions 1D and 2D. Specifically, the third sealing part 530 and the fourth sealing part 540 may extend in a fourth-second direction, respectively.

Specifically, the third sealing part 530 may extend in a direction in which the distance (d) between the third sealing part 530 and the end of the optical path control member increases while extending from the first sealing part 510 to the second sealing part 520.

That is, the third sealing part 530 may extend in the fourth-second direction in which the distance between the third sealing part 530 and the end of the optical path control member increases while extending from the first sealing part 510 to the second sealing part 520.

In addition, the fourth sealing part 530 may extend in a direction in which the distance (d) between the fourth sealing part 540 and the end of the optical path control member decreases while extending from the first sealing part 510 to the second sealing part 520.

That is, the fourth sealing part 540 may extend in the 4-2 direction in which the distance between the fourth sealing part 540 and the end of the optical path control member decreases while extending from the first sealing part 510 to the second sealing part 520.

The third sealing part 530 and the fourth sealing part 540 may be disposed to be spaced apart from each other in a set range from the end of the optical path control member. Specifically, a maximum distance md between the third sealing part 540 and the end of the optical path control member and a maximum distance md between the fourth sealing part 540 and the end of the optical path control member may be 10 mm or less. More specifically, a maximum distance md between the third sealing part 530 and the end of the optical path control member and a maximum distance md between the fourth sealing part 540 and the end of the optical path control member may be 1 mm to 10 mm.

When the maximum distance md between the third sealing part 530 and the end of the optical path control member and the maximum distance md between the fourth sealing part 540 and the end of the optical path control member exceed 10 mm, an increase in tilting angles of third sealing part 530 and the fourth sealing part 540 may reduce the light conversion region, which is the effective region of the light path control member, or increase the overall size of the light path control member to compensate for the decrease.

The optical path control member according to the embodiment may extend and arrange the third sealing part 530 and the fourth sealing part 540 in a fourth-second direction tilted with the first direction 1D and the second direction 2D, thereby reducing both length deviations of the third anchor region 532 and the fourth anchor region 542.

Therefore, the optical path control member according to the embodiment may effectively inhibit moisture that may penetrate into the accommodating part by forming an anchor region in the third sealing part and the fourth sealing part, respectively.

In addition, it is possible to minimize the reduction in the size of the light conversion region by reducing the deviation of the anchor region of the third sealing part and the deviation of the anchor region of the fourth sealing part.

Hereinafter, a display device and a display device to which an optical path control member according to an embodiment is applied will be described with reference to FIGS. 27 to 31.

Figure 27:
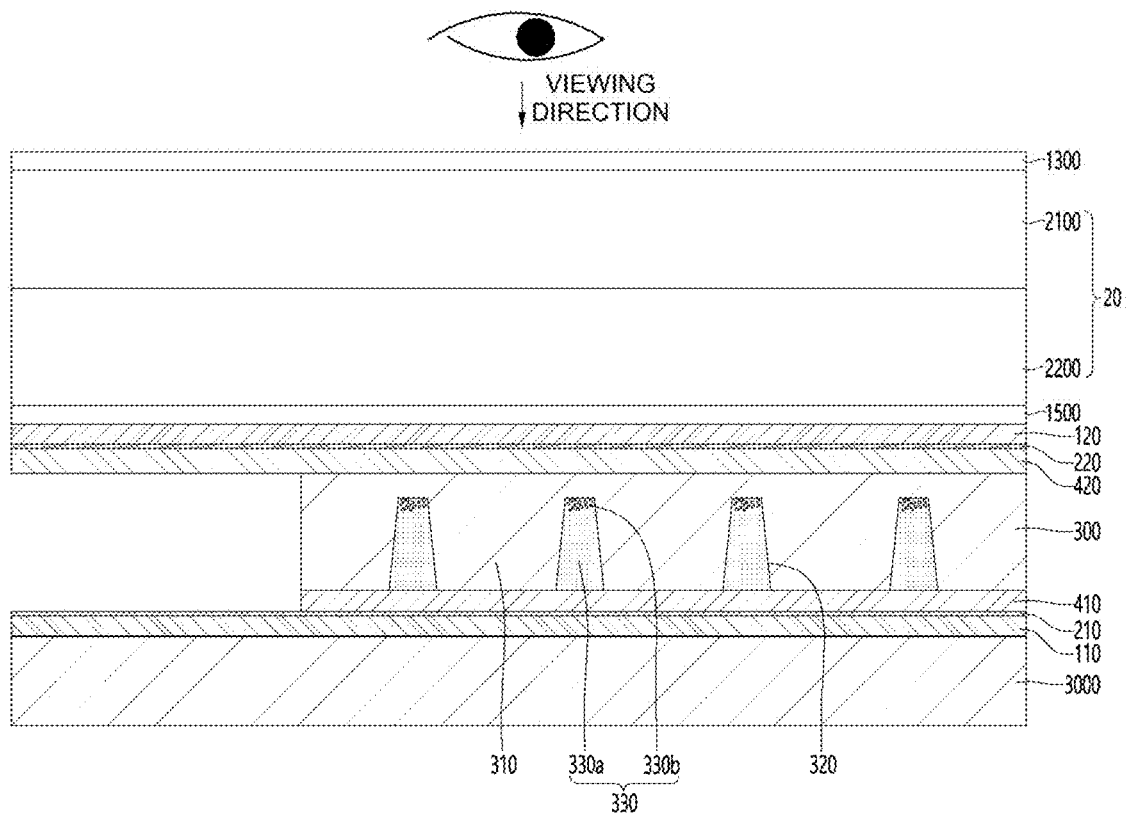
FIGS. 27 and 28 are cross-sectional views of a display device to which an optical path control member according to an embodiment is applied.
Figure 28:
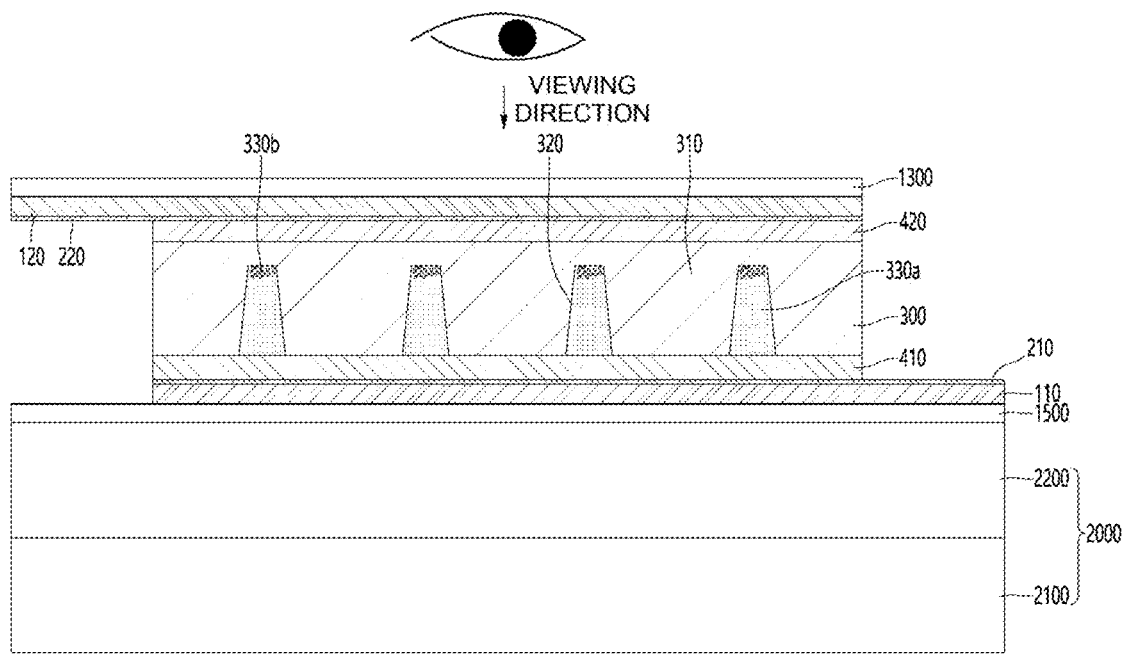

Referring to FIGS. 27 and 28, the optical path control member 1000 according to the embodiment may be disposed on or below the display panel 2000.

The display panel 2000 and the optical path control member 1000 may be disposed to be adhered to each other. For example, the display panel 2000 and the optical path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the optical path control member and the display panel, the optical path control member and the display panel may be adhered after the release film is removed.

The display panel 2000 may include a first base substrate 2100 and a second base substrate 2200. When the display panel 2000 is a liquid crystal display panel, the optical path control member may be formed under the liquid crystal panel. That is, when a surface viewed by the user in the liquid crystal panel is defined as an upper portion of the liquid crystal panel, the optical path control member may be disposed under the liquid crystal panel. The display panel 2000 may be formed in a structure in which the first base substrate 2100 including a thin film transistor (TFT) and a pixel electrode and the second base substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first base substrate 2100 and the second base substrate 2200 is bonded to the first base substrate 2100 with the liquid crystal layer interposed therebetween. That is, a thin film transistor may be formed on the first base substrate 2100, a protective film may be formed on the thin film transistor, and a color filter layer may be formed on the protective film. In addition, a pixel electrode in contact with the thin film transistor may be formed on the first base substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 27, the optical path control member may be disposed under the liquid crystal panel and on the backlight unit 3000, and the optical path control member may be disposed between the backlight unit 3000 and the display panel 2000.

Alternatively, as shown in FIG. 28, when the display panel 2000 is an organic light emitting diode panel, the optical path control member may be formed on the organic light emitting diode panel. That is, when the surface viewed by the user in the organic light emitting diode panel is defined as an upper portion of the organic light emitting diode panel, the optical path control member may be disposed on the organic light emitting diode panel. The display panel 2000 may include a self-luminous element that does not require a separate light source. In the display panel 2000, a thin film transistor may be formed on the first base substrate 2100, and an organic light emitting element in contact with the thin film transistor may be formed. The organic light emitting element may include an anode, a cathode, and an organic light emitting layer formed between the anode and the cathode. In addition, the second base substrate 2200 configured to function as an encapsulation substrate for encapsulation may be further included on the organic light emitting element.

In addition, although not shown in drawings, a polarizing plate may be further disposed between the optical path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the optical path control member 1000. Specifically, the functional layer 1300 may be adhered to one surface of the first substrate 110 of the optical path control member. Although not shown in drawings, the functional layer 1300 may be adhered to the first substrate 110 of the optical path control member via an adhesive layer. In addition, a release film for protecting the functional layer may be further disposed on the functional layer 1300.

Further, a touch panel may be further disposed between the display panel and the optical path control member.

It is shown in the drawings that the optical path control member is disposed at an upper portion of the display panel, but the embodiment is not limited thereto, and the optical path control member may be disposed at various positions such as a position in which light is adjustable, that is, a lower portion of the display panel, or between a second substrate and a first substrate of the display panel, or the like.

In addition, it is shown in the drawings that the light conversion unit of the optical path control member according to the embodiment is in a direction parallel or perpendicular to an outer surface of the second substrate, but the light conversion unit is formed to be inclined at a predetermined angle from the outer surface of the second substrate. Through this, a moiré phenomenon occurring between the display panel and the optical path control member may be reduced.

Figure 31:

Referring to FIGS. 29 to 31, the optical path control member according to the embodiment may be applied to a display device that displays a display.

For example, when power is applied to the optical path control member as shown in FIG. 29, the accommodating part functions as the light transmitting part, so that the display device may be driven in the public mode, and when power is not applied to the optical path control member as shown in FIG. 30, the accommodating part functions as the light blocking part, so that the display device may be driven in the light blocking mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 31, the display device to which the optical path control member according to the embodiment is applied may also be applied inside a vehicle.

For example, the display device including the optical path control member according to the embodiment may display a video confirming information of the vehicle and a movement route of the vehicle. The display device may be disposed between a driver seat and a passenger seat of the vehicle.

In addition, the optical path control member according to the embodiment may be applied to a dashboard that displays a speed, an engine, an alarm signal, and the like of the vehicle.

Further, the optical path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. An optical path control member comprising:
a first substrate;
a first electrode disposed on the first substrate;
a second electrode disposed on the first electrode;
a second substrate disposed on the second electrode;
a light conversion unit disposed between the first electrode and the second electrode and including a plurality of accommodating parts in which a light conversion material is disposed;
a first sealing part and a second sealing part formed in a cutting region formed by cutting the second substrate, the second electrode, and the light conversion unit and disposed extending in a first direction; and
a third sealing part and a fourth sealing part formed in the cutting region formed by cutting the second substrate, the second electrode, and the light conversion unit and disposed extending in a second direction different from the first direction, and
wherein a length of the first sealing part in the first direction is different from a length of the second sealing part in the first direction.

2. The optical path control member of claim 1, wherein lengths of the plurality of accommodating parts change while extending in the first direction.

3. The optical path control member of claim 2, wherein the third sealing part includes a third sealing region disposed in the cutting region and a third anchor region disposed in a respective one of the accommodating parts,
wherein the third anchor region includes a first length defined as a length in the first direction from an interface between the third sealing region and the third anchor region to an end of the third anchor region, and a second length defined as a length of its respective accommodating part in a length direction from the interface between the third sealing region and the third anchor region to the end of the third anchor region, and
wherein at least one of the first length and the second length varies according to a position of the accommodating part in which the third anchor region is disposed.

4. The optical path control member of claim 3, wherein at least one of the first length of the third anchor region and the second length of the third anchor region varies while extending in the second direction.

5. The optical path control member of claim 4, wherein at least one of the first length of the third anchor region and the second length of the third anchor region decreases while extending from the first sealing part toward the second sealing part.

6. The optical path control member of claim 3, wherein the fourth sealing part includes a fourth sealing region disposed in the cutting region and a fourth anchor region disposed in a respective one of the accommodating parts,
wherein the fourth anchor region includes a first length defined as a length in the first direction from an interface between the fourth sealing region and the fourth anchor region to an end of the fourth anchor region, and a second length defined as a length of its respective accommodating part in a length direction from the interface between the fourth sealing region and the fourth anchor region to the end of the fourth anchor region, and
wherein at least one of the first length and the second length varies according to a position of the accommodating part in which the fourth anchor region is disposed.

7. The optical path control member of claim 6, wherein at least one of the first length of the fourth anchor region and the second length of the fourth anchor region increases while extending from the first sealing part toward the second sealing part.

8. The optical path control member of claim 6, wherein the first substrate and the second substrate include a connection region connected to an external printed circuit board, and
wherein at least one of the first length of the fourth anchor region and the second length of the fourth anchor region increases as it approaches the connection region.

9. The optical path control member of claim 6, wherein at least one of the first and second lengths of the third anchor region and the first and second lengths of the fourth anchor region is proportional to a length of the respective accommodating part.

10. The optical path control member of claim 6, wherein at least one of the first length of the third anchor region and the first length of the fourth anchor region is 30 μm to 1000 μm, and wherein at least one of the second length of the third anchor region and the second length of the fourth anchor region is 50 μm to 1500 μm.

11. The optical path control member of claim 6, wherein the first sealing part includes a first sealing region disposed in the cutting region and a first anchor region disposed in the accommodating part,
wherein the first anchor region has a first length defined as a length in the first direction from an interface of the first sealing region and the first anchor region to an end of the first anchor region, and a second length defined as a length defined as a length in the length direction of the accommodating part from the interface of the first sealing region and the first anchor region to the end of the first anchor region,
wherein the second sealing part includes a second sealing region disposed in the cutting region and a second anchor region disposed in the accommodating part,
wherein the second anchor region has a first length defined as a length in the first direction from an interface between the second sealing region and the second anchor region to an end of the second anchor region, and a second length defined as a length defined as a length in the length direction of the accommodating part from the interface between the second sealing region and the second anchor region to the end of the second anchor region,
wherein at least one of a maximum length of the first length of the first anchor region and a maximum length of the first length of the second anchor region is different from at least one of a maximum length of the first length of the third anchor region and a maximum length of the first length of the fourth anchor region, and
wherein at least one of a maximum length of the second length of the first anchor region and a maximum length of the second length of the second anchor region is different from at least one of a maximum length of the second length of the third anchor region and a maximum length of the second length of the fourth anchor region.

12. The optical path control member of claim 11, wherein at least one of the maximum length of the first length of the first anchor region and the maximum length of the first length of the second anchor region is greater than at least one of the maximum length of the first length of the third anchor region and the maximum length of the first length of the fourth anchor region, and
wherein at least one of the maximum length of the second length of the first anchor region and the maximum length of the second length of the second anchor region is greater than at least one of the maximum length of the second length of the third anchor region and the maximum length of the second length of the fourth anchor region.

13. The optical path control member of claim 1, wherein each of the plurality of accommodating parts includes one end and an other end,
wherein the one end of each of the plurality of accommodating parts is in contact with any one of the first sealing part and the third sealing part, and
wherein the other ends of each of the plurality of accommodating parts are in contact with any one of the second sealing part and the fourth sealing part.

14. The optical path control member of claim 1, wherein each of the plurality of accommodating parts includes one end and an other end,
wherein the one end of each of the plurality of accommodating parts is in contact with any one of the first sealing part and the fourth sealing part, and
wherein the other ends of each of the plurality of accommodating parts are in contact with any one of the second sealing part and the third sealing part.

15. The optical path control member of claim 1, wherein the first sealing part includes a first outer surface overlapping the second substrate, the second electrode, and the light conversion part in the second direction, and,
wherein the second substrate includes a first side end positioned closest to the first outer surface, and
wherein the first outer surface is provided further outside than the first side end based on the second direction.

16. The optical path control member of claim 1, wherein the second sealing part includes a second outer surface overlapping the second substrate, the second electrode, and the light conversion part in the second direction, and,
wherein the second substrate includes a second side end positioned closest to the second outer surface, and
wherein the second outer surface is provided further inside the second side end based on the second direction.

17. The optical path control member of claim 1, wherein at least one of the first sealing part, the second sealing part, the third sealing part, and the fourth sealing part includes a region whose width is narrowed in a direction from the second substrate toward the first substrate.

18. The optical path control member of claim 1, wherein the second direction is perpendicular to the first direction.

19. The optical path control member of claim 1, wherein the second direction has a predetermined inclination with respect to a direction perpendicular to the first direction.

20. A display device comprising:
a panel including at least one of a display panel or a touch panel; and
the optical path control member of claim 1 disposed on or under the panel.

* * * * *